(12) United States Patent
Yamakoshi et al.

(10) Patent No.: US 9,905,413 B2
(45) Date of Patent: Feb. 27, 2018

(54) METHOD OF MANUFACTURING SEMICONDUCTOR DEVICE

(71) Applicant: HITACHI KOKUSAI ELECTRIC INC., Tokyo (JP)

(72) Inventors: Risa Yamakoshi, Toyama (JP); Takashi Ozaki, Toyama (JP); Masato Terasaki, Toyama (JP); Naonori Akae, Toyama (JP); Hideki Horita, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 15/453,163

(22) Filed: Mar. 8, 2017

(65) Prior Publication Data
US 2017/0178889 A1  Jun. 22, 2017

Related U.S. Application Data

(63) Continuation of application No. PCT/JP2014/073675, filed on Sep. 8, 2014.

(51) Int. Cl.
| H01L 21/02 | (2006.01) |
| C23C 16/34 | (2006.01) |
| C23C 16/455 | (2006.01) |

(52) U.S. Cl.
CPC .......... *H01L 21/0214* (2013.01); *C23C 16/34* (2013.01); *C23C 16/45527* (2013.01); *H01L 21/0228* (2013.01)

(58) Field of Classification Search
CPC . H01L 21/02; H01L 21/0223; H01L 21/0214; H01L 21/0228; H01L 21/02247; C23C 16/34; C23C 16/45527
See application file for complete search history.

(56) References Cited

U.S. PATENT DOCUMENTS

| 2003/0020073 A1* | 1/2003 | Long ................... H01L 27/3211 257/79 |
| 2005/0268851 A1 | 12/2005 | Yamamoto |
| 2007/0237699 A1* | 10/2007 | Clark ................... C23C 16/308 423/263 |
| 2008/0242109 A1 | 10/2008 | Reid et al. |
| 2009/0170345 A1 | 7/2009 | Akae et al. |

(Continued)

FOREIGN PATENT DOCUMENTS

| JP | 2001-015506 A | 1/2001 |
| JP | 2002-026317 A | 1/2002 |

(Continued)

*Primary Examiner* — Phuc Dang
(74) *Attorney, Agent, or Firm* — Volpe and Koenig, P.C.

(57) ABSTRACT

A method of manufacturing a semiconductor device may include: performing a cycle a predetermined number of times to form an oxynitride film on a substrate, the cycle including: (a) supplying a source gas to the substrate via a first nozzle; and (b) supplying a nitriding gas and an oxidizing gas to the substrate via a second nozzle different from the first nozzle, wherein (a) and (b) are performed non-simultaneously, wherein (b) may include: (b-1) supplying only the oxidizing gas while suspending a supply of the nitriding gas; and (b-2) simultaneously supplying the nitriding gas and the oxidizing gas, wherein (b-1) and (b-2) are consecutively performed.

13 Claims, 28 Drawing Sheets

(56) References Cited

U.S. PATENT DOCUMENTS

| | | |
|---|---|---|
| 2012/0214300 A1 | 8/2012 | Kaga et al. |
| 2013/0072027 A1* | 3/2013 | Ota .................... H01L 21/0214 |
| | | 438/762 |
| 2013/0149874 A1* | 6/2013 | Hirose .............. H01L 21/02271 |
| | | 438/763 |
| 2013/0252439 A1 | 9/2013 | Hirose et al. |
| 2013/0260576 A1 | 10/2013 | Kadonaga et al. |
| 2014/0087565 A1 | 3/2014 | Yamaguchi et al. |

FOREIGN PATENT DOCUMENTS

| | | | |
|---|---|---|---|
| JP | 2005-347447 A | 12/2005 | |
| JP | 2008-258614 A | 10/2008 | |
| JP | 2010-050425 A | 3/2010 | |
| JP | 2012-184499 A | 9/2012 | |
| JP | 2013-206989 A | 10/2013 | |
| JP | 2013-225660 A | 10/2013 | |
| JP | 2014-082457 A | 5/2014 | |

* cited by examiner

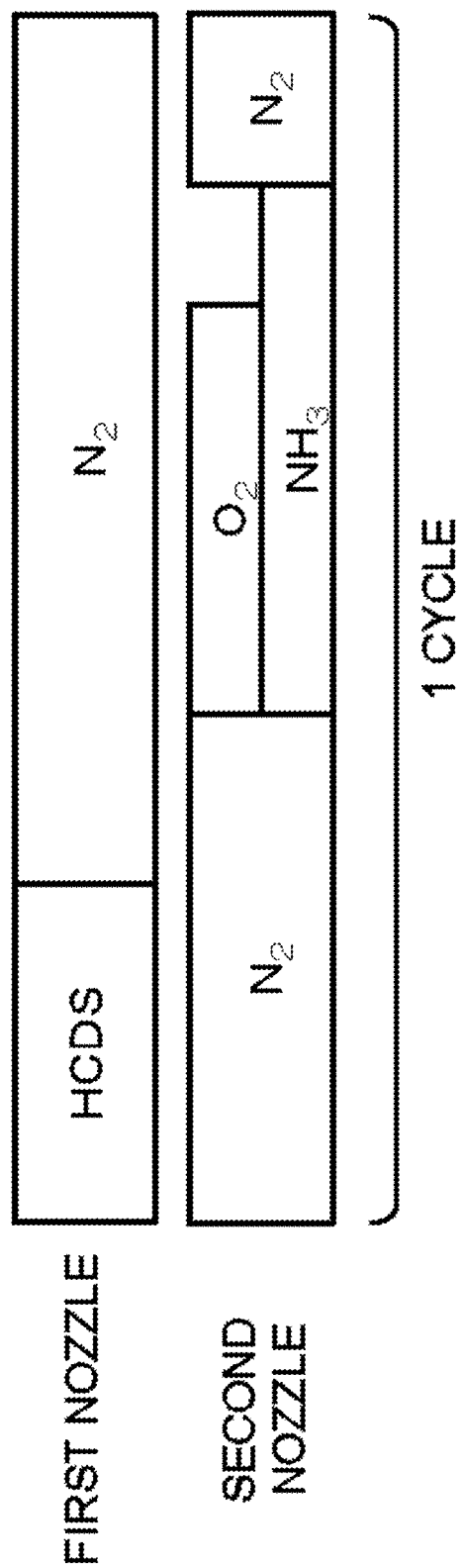

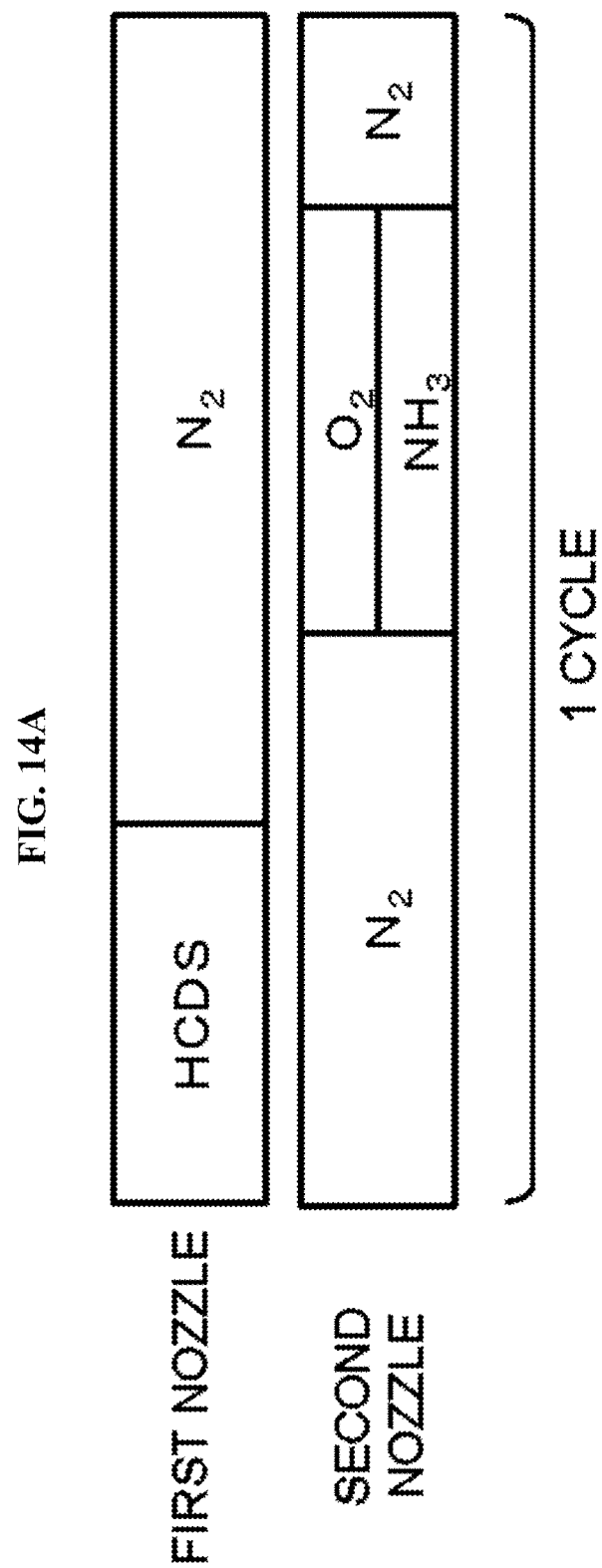

FIG. 14B

| Zone | TOP | CENTER | BOTTOM |
|---|---|---|---|
| Thick Map | | | |
| Thick(Å) | 243.8 | 236.3 | 233.2 |
| WiW(%) | 0.9 | 1.5 | 1.7 |
| WtW(%) | | 2.2 | |
| N CONCENTRATION(%) | | 5.8 | |
| R.I. | 1.587 | 1.587 | 1.589 |

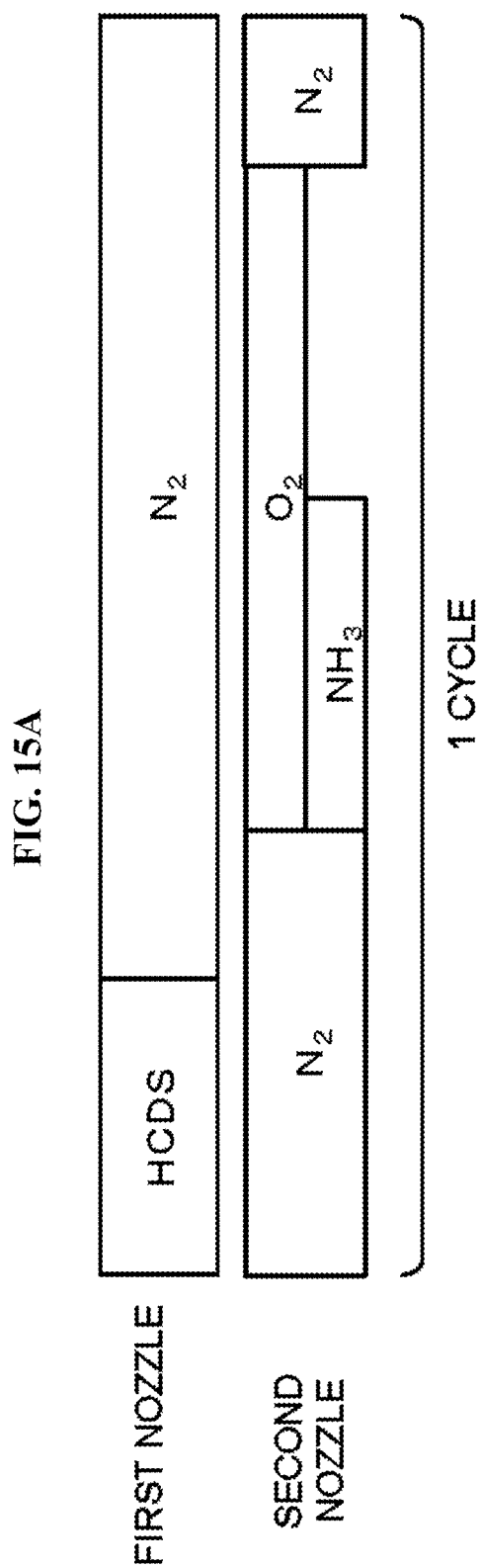

FIG. 15B
| Zone | TOP | CENTER | BOTTOM |
|---|---|---|---|
| Thick Map | 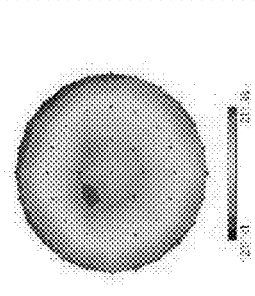 | 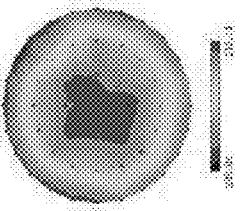 | 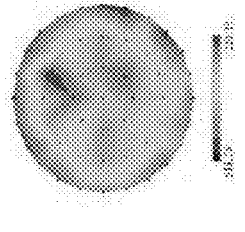 |
| Thick(Å) | 217 | 209.7 | 205.9 |
| WiW(%) | 1.4 | 1.8 | 2.6 |
| WtW(%) | | 2.6 | |
| N CONCENTRATION(%) | | 1.2 | |
| R.I. | 1.558 | 1.557 | 1.556 |

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of PCT/JP2014/073675, filed on Sep. 8, 2014, the entire contents of which are hereby incorporated by reference.

BACKGROUND

1. Field

The present disclosure relates to a method of manufacturing a semiconductor device.

2. Description of the Related Art

A process of forming an oxynitride film on a substrate by supplying a source gas, oxidizing gas and nitriding gas to the substrate in a process chamber may be performed as one of manufacturing processes for a semiconductor device. According to the research results, the inventors of the present application have checked that a large amount of particles can be generated in the process chamber when the oxidizing gas and the nitriding gas are supplied into the process chamber.

SUMMARY

Described herein is a technique capable of suppressing a production of particles when an oxynitride film is formed on a substrate.

According to one aspect described herein, a method of manufacturing a semiconductor device may include: performing a cycle a predetermined number of times to form an oxynitride film on a substrate, the cycle including: (a) supplying a source gas to the substrate via a first nozzle; and (b) supplying a nitriding gas and an oxidizing gas to the substrate via a second nozzle different from the first nozzle, wherein (a) and (b) are performed non-simultaneously, wherein (b) may include: (b-1) supplying only the oxidizing gas while suspending a supply of the nitriding gas; and (b-2) simultaneously supplying the nitriding gas and the oxidizing gas, wherein (b-1) and (b-2) are consecutively performed.

BRIEF DESCRIPTION OF THE DRAWINGS

FIG. 13A is a diagram illustrating timings at which gases are supplied during one cycle of a film-forming sequence used for manufacturing a third sample, for each nozzle.

FIG. 14A is a diagram illustrating timings at which gases are supplied during one cycle of a film-forming sequence used for manufacturing a fourth sample, for each nozzle.

FIG. 14B is a diagram illustrating a result obtained by evaluating a SION film formed on a wafer.

FIG. 15A is a diagram illustrating timings at which gases are supplied during one cycle of a film-forming sequence used for manufacturing a fifth sample, for each nozzle.

FIG. 15B is a diagram illustrating a result obtained by evaluating a SION film formed on a wafer.

DETAILED DESCRIPTION

Embodiment

Hereafter, embodiments will be described with reference to FIGS. 1 through 3.

(1) Configuration of Substrate Processing Apparatus

Figure 1:
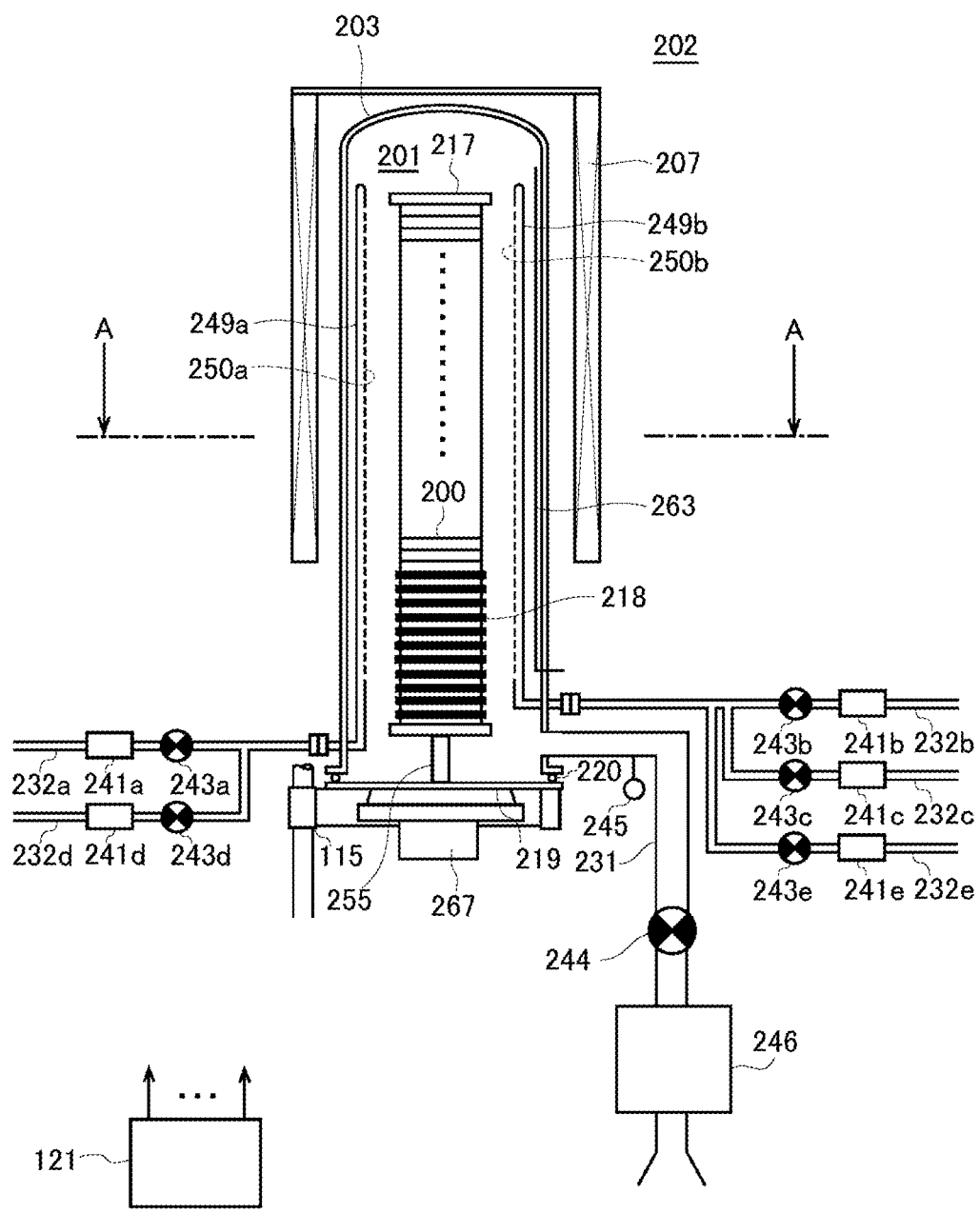
FIG. 1 is a diagram schematically illustrating a configuration of a vertical processing furnace of a substrate processing apparatus which is used in an embodiment described herein, including a longitudinal sectional view of the processing furnace.
Figure 2:
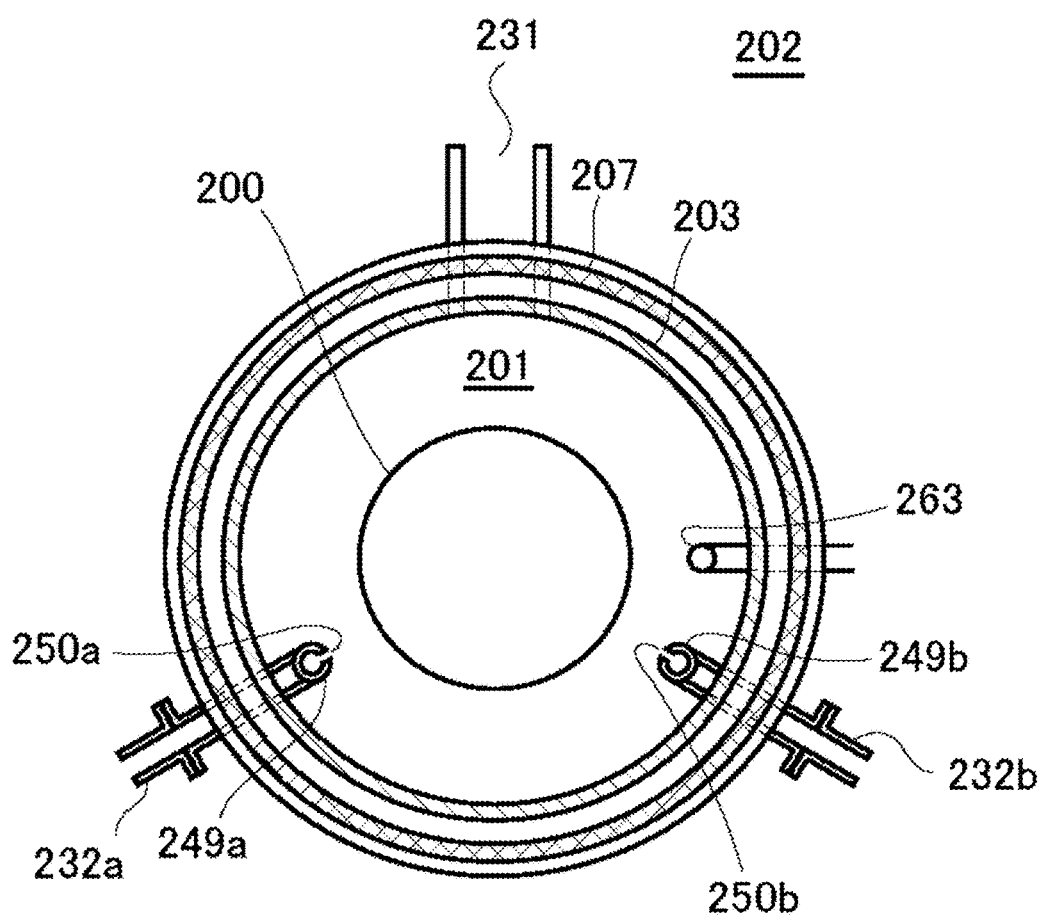
FIG. 2 is a cross-sectional view taken along the line A-A of FIG. 1, schematically illustrating a part of the vertical processing furnace of the semiconductor processing apparatus which is specifically used in the embodiment described herein.

As illustrated in FIG. 1, a processing furnace 202 includes a heater 207 serving as a heating unit (heating mechanism). The heater 207 is cylindrical, and vertically installed while being supported by a heater base (not illustrated) serving as a support plate. As described later, the heater 207 also functions as an activation mechanism (excitation unit) for activating (exciting) a gas into heat.

A reaction tube 203 constitutes a reaction container (processing container), and is installed in the heater 207 so as to be concentric with the heater 207. The reaction tube 203 is made of a heat-resisting material such as quartz ($SiO_2$) and silicon carbide (SiC), and cylindrical with a closed upper end and an open lower end. A process chamber 201 is formed in a hollow cylindrical portion of the reaction tube 203. The process chamber 201 is configured to house wafers 200 as substrates therein, while the wafers 200 are horizontally positioned and vertically aligned in multi-stages by a boat 217 described later.

A nozzle 249a (first nozzle) and a nozzle 249b (second nozzle) are installed in the process chamber 201 through the bottom sidewalls of the reaction tube 203. The nozzles 249a and 249b are made of a heat-resisting material such as $SiO_2$ and SiC. Gas supply pipes 232a and 232b are connected to the nozzles 249a and 249b, respectively. A gas supply pipe 232c is connected to the gas supply pipe 232b. As such, the two nozzles 249a and 249b and the three gas supply pipes 232a through 232c may be installed at the reaction tube 203, and supply plural kinds of gases into the process chamber 201.

The processing furnace 202 according to the present embodiment is not limited to the above-described configuration. For example, a manifold (not illustrated) made of metal may be installed under the reaction tube 203 and support the reaction tube 203, and the nozzles 249a and 249b may be installed through the sidewalls of the manifold. An exhaust pipe 231 described later may also be installed at the manifold. Alternatively, the exhaust pipe 231 may not be installed at the manifold, but installed at the lower portion of the reaction tube 203. As such, a furnace opening of the processing furnace 202 may be made of metal, and a component such as a nozzle may be installed at the furnace opening made of metal.

MFCs (Mass Flow Controllers) 241a through 241c serving as flow rate controllers (flow rate control units) and valves 243a through 243c serving as opening/closing valves are sequentially installed at the respective gas supply pipes 232a through 232c from the upstream sides toward the downstream sides of the gas supply pipes 232a through 232c. Gas supply pipes 232d and 232e for supplying an inert gas are connected to the downstream sides of the valves 243a and 243c installed at the gas supply pipes 232a and 232b, respectively. MFCs 241d and 241e serving as flow controllers (flow control units) and valves 243d and 243e serving as opening/closing valves are sequentially installed at the respective gas supply pipes 232d and 232e from the upstream sides toward the downstream sides of the gas supply pipes 232d and 232e.

Nozzles 249a and 249b are connected to the front ends of the gas supply pipes 232a and 232b, respectively. As illustrated in FIG. 2, the nozzles 249a and 249b are installed in an annular space between the inner wall of the reaction tube 203 and a wafer 200, and extended from bottom to top of the inner wall of the reaction tube 203 along the stacking direction of the wafers 200. That is, the nozzles 249a and 249b are installed in regions which are formed at sides of the wafer arrangement region where the wafers 200 are arranged and horizontally surround the wafer arrangement region, along the wafer arrangement region. That is, the nozzles 249a and 249b are installed at sides of the end (periphery) of the wafer 200 loaded into the process chamber 201 so as to be perpendicular to the surface (horizontal surface) of the wafer 200. The nozzles 249a and 249b include L-shaped long nozzles. The horizontal portions of the nozzles 249a and 249b are installed through the bottom sidewall of the reaction tube 203, and the vertical portions of the nozzles 249a and 249b are erected at least from one end toward the other end of the wafer arrangement region. Gas supply holes 250a and 250b for supplying gases are installed at side surfaces of the respective nozzles 249a and 249b. The gas supply holes 250a and 250b may be opened toward the center of the reaction tube 203, and configured to supply gases toward the wafer 200. The plurality of gas supply holes 250a and 250b are installed across the reaction tube 203 from top to bottom thereof. The plurality of gas supply holes 250a and 250b have the same opening area and opening pitch.

According to the present embodiment, gas is supplied via the nozzles 249a and 249b arranged in the vertically long annular space which is defined by the inner wall of the reaction tube 230 and the ends of the plurality of stacked wafers 200, that is, the cylindrical space. The gas is first jetted into the reaction tube 203 around the wafer 200 through the gas supply holes 250a and 250b installed at the nozzles 249a and 249b. The gas flows in the reaction tube 203 mainly in a direction parallel to the surface of the wafer 200, that is, the horizontal direction. According to such a configuration, the gas may be uniformly supplied to each of the wafers 200. Thus, the uniformity in thickness of a thin film formed on each of the wafers 200 can be improved. The gas having flown on the surface of the wafer 200, that is, a residual gas after reaction flows toward an exhaust port, that is, an exhaust pipe 231 described later. However, the flow direction of the residual gas is properly specified by the location of the exhaust port, and not limited to the vertical direction.

A source gas containing a predetermined element, for example, a halosilane source gas containing silicon (Si) and halogen elements is supplied into the process chamber 201 via the WC 241a, the valve 243a and the nozzle 249a which are installed at the gas supply pipe 232a.

The halosilane source gas includes a gaseous halosilane source, for example, a gas which can be obtained by evaporating a halosilane source in a liquid state under normal temperature and pressure or a halosilane source in a gaseous state under normal temperature and pressure. The halosilane source is a silane source containing a halogen group. The halogen group includes a chloro group, a fluoro group, a bromo group and an iodine group. That is, the halogen group includes halogen elements such as chlorine (Cl), fluorine (F), bromine (Br) and iodine (I). The halosilane source may indicate a kind of halide. In this specification, "source" may indicate "liquid source in liquid state" or "source gas in gaseous state", or indicate both of them.

For example, a source gas containing Si and Cl, that is, a chlorosilane source gas may be used as the halosilane source gas. For example, hexachlorodisilane ($Si_2Cl_6$, abbreviated to HCDS) gas may be used as the chlorosilane source gas. When a liquid source in a liquid state under normal temperature and pressure, such as HCDS, is used, the liquid source may be evaporated by an evaporation system such as an evaporator and bubbler, and then supplied as a source gas (HCDS gas).

An oxygen(O)-containing gas, which is a reaction gas having a different chemical structure (molecular structure) from the source gas, is supplied into the process chamber 201 via the MFC 241b, the valve 243b and the nozzle 249b which are installed at the gas supply pipe 232b. The O-containing gas serves as an oxidizing gas, that is, an oxygen source during substrate processing described later. For example, oxygen ($O_2$) gas may be used as the O-containing gas.

A carbon(C)-containing gas, which is a reaction gas having a different chemical structure from the source gas, is supplied into the process chamber 201 via the MFC 241b, the valve 243b and the nozzle 249b which are installed at the gas supply pipe 232b. For example, a hydrocarbon-based gas may be used as the C-containing gas. The hydrocarbon-based gas may be referred to as a material constituted by only two elements of C and hydrogen (H). The hydrocarbon-based gas serves as a carbon source during the substrate processing described later. For example, propylene ($C_3H_6$) gas may be used as the hydrocarbon-based gas.

A nitrogen (N) and C-containing gas, which is a reaction gas having a different chemical structure from the source gas, is supplied into the process chamber 201 via the MFC 241b, the valve 243b and the nozzle 249b which are installed at the gas supply pipe 232b. For example, an amine-based gas may be used as the N and C-containing gas.

The amine-based gas may include a gas which can be obtained by evaporating gaseous amine, that is, amine in a liquid state under normal temperature and pressure and a gas containing an amine group, such as amine in a gaseous state under normal temperature and pressure. The amine-based gas includes amines such as ethylamine, methylamine, propylamine, isopropylamine, butylamine and isobutylamine. The amine collectively refers to compounds which can be obtained by substituting H of ammonia ($NH_3$) with a hydrocarbon group such as an alkyl group. The amine is a ligand containing carbon, that is, an organic ligand, and contains a hydrocarbon group such as alkyl group. Since the amine-based gas contains three elements, that is, C, N and H and does not contain Si, the amine-based gas may be referred to as a gas free of Si. Since the amine-based gas does not include Si and metal, the amine-based gas may be referred to as a gas free of Si and metal. The amine-based gas may be referred to as a material constituted by only three elements of C, N and H. The amine-based gas not only serves as a nitrogen source, but also serves as a carbon source during the substrate processing described later. In this specification, "amine" may indicate "liquid amine" or "amine-based gas in gaseous state", or indicate both of them.

For example, triethylamine (($C_2H_5$)$_3$N, abbreviated to TEA) gas may be used as the amine-based gas. The TEA gas contains a plurality of ligands (ethyl groups) containing carbon in the chemical constitution (one molecule) thereof, and the number of C elements in one molecule thereof is larger than the number of N elements. When amine in a liquid state under normal temperature and pressure, such as TEA, is used, the liquid amine may be evaporated by an evaporation system such as an evaporator and bubbler, and then supplied as the amine-based gas (TEA gas).

A boron(B)-containing gas free of borazine ring skeleton, which is a reaction gas having a different chemical structure from the source gas, is supplied into the process chamber 201 via the MFC 241b, the valve 243b and the nozzle 249b which are installed at the gas supply pipe 232b. For example, a borane-based gas may be used as the B-containing gas free of borazine ring skeleton.

The borane-based gas is a gaseous borane compound, such as a gas which can be obtained by evaporating a borane compound in a liquid state under normal temperature and pressure and a borane compound in a gaseous state under normal temperature and pressure. The borane compound includes a haloborane compound containing B and halogen elements, for example, a chloroborane compound containing B and Cl. The borane compound includes borane (boron hydride) such as monoborane ($BH_3$) and diborane ($B_2H_6$) or a borane compound (borane derivative) obtained by substituting H of the borane with another element. The borane-based gas serves as a B source during the substrate processing described later. For example, trichloroborane ($BCl_3$) may be used as the borane-based gas. The $BCl_3$ gas is a B-containing gas free of borazine compound, which is described later, that is, a non-borazine-based B-containing gas.

A borazine ring skeleton-containing gas, which is a reaction gas having a different chemical structure from the source gas, is supplied into the process chamber 201 via the MFC 241b, the valve 243b and the nozzle 249b which are installed at the gas supply pipe 232b. For example, a gas containing a borazine ring skeleton and organic ligand, that is, an organic borazine-based gas may be used as the borazine ring skeleton-containing gas.

For example, a gas containing an alkylborazine compound as an organic borazine compound may be used as the organic borazine-based gas. The organic borazine-based gas may be referred to as a borazine compound gas or borazine-based gas. In the present embodiment, the borazine includes a heterocyclic compound constituted by three elements of B, N and H, and has a composition formula expressed as $B_3H_6N_3$. The borazine compound is a compound containing a borazine ring skeleton (also referred to as borazine skeleton) constituting a borazine ring composed of three B elements and three N elements. The organic borazine compound is a borazine compound containing C, and may also be referred to as a borazine compound containing a C-containing ligand, that is, an organic ligand. The alkylborazine compound is a borazine compound containing an alkyl group, and may also be referred to as a borazine compound containing an alkyl group as an organic ligand. The alkylborazine compound is obtained by substituting at least one of six H elements contained in the borazine with hydrogen carbide containing one or more C elements. The alkylborazine compound may be referred to as a material which has a borazine ring skeleton constituting a borazine ring and contains B, N, H and C. Furthermore, the alkylborazine compound may be referred to as a material which has a borazine ring skeleton and contains an alkyl ligand. The borazine-based gas serves as a B source, serves as a N source, and serves as a C source during the substrate processing described later.

For example, n,n',n''-trimethylborazine (abbreviated to TMB) gas, n,n',n''-triethylborazine (abbreviated to TEB) gas, n,n',n''-tri-n-propylborazine (abbreviated to TPB) gas, n,n',n''-triisopropylborazine (abbreviated to TIPB) gas, n,n', n"-tri-n-butylborazine (abbreviated to TBB) gas and n,n',n"-triisobutylborazine (abbreviated to TIBB) gas may be used as the borazine-based gas. When the borazine compound in a liquid state under normal temperature and pressure, such as TMB, is used, the borazine compound in a liquid state is evaporated by an evaporation system such as an evaporator and bubbler, and then supplied as the borazine-based gas (TMB gas or the like).

A N-containing gas, which is a reaction gas having a different chemical structure (molecular structure) from the source gas, is supplied into the process chamber 201 via the MFC 241c, the valve 243c, the gas supply pipe 232b and the nozzle 249b which are installed at the gas supply pipe 232c. For example, a hydronitrogen-based gas may be used as the N-containing gas. The hydronitrogen-based gas may be referred to as a material constituted by only two elements of N and H. The hydronitrogen-based gas serves as a nitriding gas, that is, a N source during the substrate processing described later. For example, ammonia ($NH_3$) gas may be used as the hydronitrogen-based gas.

An inert gas, for example, nitrogen ($N_2$) gas is supplied into the process chamber 201 via the MFCs 241d and 241e, the valves 243d and 243e, the gas supply pipes 232a an 232b and the nozzles 249a and 249b, which are installed at the gas supply pipes 232d and 232e, respectively.

In case that the source gas is supplied through the gas supply pipe 232a, a source gas supply system includes the gas supply pipe 232a, the MFC 241a and the valve 243a. The source gas supply system may further include the nozzle 249a. The source gas supply system may be referred to as a source supply system. In case that halosilane source gas is supplied through the gas supply pipe 232a, the source gas supply system may be referred to as a halosilane source gas supply system or halosilane source supply system.

In case that the O-containing gas is supplied through the gas supply pipe 232b, an O-containing gas supply system includes the gas supply pipe 232b, the MFC 241b and the valve 243b. The O-containing gas supply system may further include the nozzle 249b. The O-containing gas supply system may be referred to as an oxidizing gas supply system or oxidizing agent supply system.

In case that the C-containing gas is supplied through the gas supply pipe 232b, a C-containing gas supply system includes the gas supply pipe 232b, the MFC 241b and the valve 243b. The C-containing gas supply system may further include the nozzle 249b. In case that the hydrocarbon-based gas is supplied through the gas supply pipe 232b, the C-containing gas supply system may be referred to as a hydrocarbon-based gas supply system or hydrocarbon supply system.

In case that the N and C-containing gas is supplied through the gas supply pipe 232b, a N and C-containing gas supply system includes the gas supply pipe 232b, the MFC 241b and the valve 243b. The N and C-containing gas supply system may further include the nozzle 249b. In case that the amine-based gas is supplied through the gas supply pipe 232b, the N and C-containing gas supply system may be referred to as an amine-based gas supply system or amine supply system. Since the N and C-containing gas is either a N-containing gas or a C-containing gas, the N and C-containing gas supply system may be included in the C-containing gas supply system or N-containing gas supply system described later.

In case that the B-containing gas is supplied through the gas supply pipe 232b, a B-containing gas supply system includes the gas supply pipe 232b, the MFC 241b and the valve 243b. The B-containing gas supply system may further include the nozzle 249b. In case that the borane-based gas is supplied through the gas supply pipe 232b, the B-containing gas supply system may be referred to as a borane-based gas supply system or borane compound supply system. In case that the borazine-based gas is supplied through the gas supply pipe 232b, the B-containing gas supply system may be referred to as a borazine-based gas supply system, organic borazine-based gas supply system or borazine compound supply system. Since the borazine-based gas is the N and C-containing gas, that is, either the N-containing gas or the C-containing gas, the borazine-based gas supply system may be included in the N and C-containing gas supply system, the C-containing gas supply system and the N-containing gas supply system described later.

In case that the N-containing gas is supplied through the gas supply pipe 232c, the N-containing gas supply system includes the gas supply pipe 232c, the MFC 241c and the valve 243c. The N-containing gas supply system may further include the nozzle 249b and the downstream side of the connection portion between the gas supply pipe 232c and the gas supply pipe 232b. The N-containing gas supply system may be referred to as a nitriding gas supply system or nitriding agent supply system. In case that the hydronitrogen-based gas is supplied through the gas supply pipe 232c, the N-containing gas supply system may be referred to as a hydronitrogen-based gas supply system or hydronitrogen supply system.

Any one or all of the O-containing gas supply system, the C-containing gas supply system, the N and C-containing gas supply system, the B-containing gas supply system and the N-containing gas supply system, which have been described above, may be referred to as a reaction gas supply system or reactant supply system.

An inert gas supply system includes the gas supply pipes 232d and 232e, the MFCs 241d and 241e and the valves 243d and 243e. The inert gas supply system may be referred to as a purge gas supply system, dilution gas supply system or carrier gas supply system.

The exhaust pipe 231 for exhausting the inner atmosphere of the process chamber 201 is installed at the reaction tube 203. A vacuum pump 246 serving as a vacuum exhauster is connected to the exhaust pipe 231 via a pressure sensor 245 and an APC (Automatic Pressure Controller) valve 244. The pressure sensor 245 serves as a pressure detector (pressure detection unit) to detect the inner pressure of the process chamber 201, and the APC valve 244 serves as a pressure controller (pressure control unit). With the vacuum pump 246 in operation, the APC valve 244 may be opened/closed to vacuum-exhaust the process chamber 201 or suspend the vacuum exhaust. With the vacuum pump 246 in operation, the inner pressure of the process chamber 201 may be controlled by adjusting the opening degree of the APC valve 244 may be adjusted based on the pressure information detected by the pressure sensor 245. An exhaust system includes the exhaust pipe 231, the APC valve 244 and the pressure sensor 245. The exhaust system may further include the vacuum pump 246.

A seal cap 219 serving as a furnace opening lid can airtightly seal the lower end opening of the reaction tube 203, and is installed under the reaction tube 203. The seal cap 219 is installed to be in contact with the lower end of the reaction tube 203 from the bottom in the vertical direction. The seal cap 219 is made of metal such as SUS, for example, and formed in a disk shape. An O-ring 220 serving as a seal member which is in contact with the lower end of the reaction tube 203 is installed on the upper surface of the seal cap 219. A rotating mechanism 267 to rotate a boat 217 described later is installed on the seal cap 219 at the opposite side of the process chamber 201. The rotating mechanism 267 has a rotating shaft 255 connected to the boat 217 through the seal cap 219. As the rotating mechanism 267 rotates the boat 217, the wafer 200 is rotated. The seal cap 219 is moved upward/downward in the vertical direction by a boat elevator 115 which is vertically installed outside the reaction tube 203. When the seal cap 219 is moved upward/downward by the boat elevator 115, the boat 217 may be loaded into the process chamber 201 or unloaded out of the process chamber 201. That is, the boat elevator 115 serves as a transfer device (transfer mechanism) that loads the boat 217 or the wafer 200 into the process chamber 201 or unloads the boat 217 or the wafer 200 out of the process chamber 201.

The boat 217 serving as a substrate support aligns a plurality of wafers 200, for example, 25 to 200 wafers 200 in the vertical direction and supports the plurality of wafers 200, while the wafers 200 are horizontally positioned and centered with each other. That is, the plurality of wafers 200, for example, 25 to 200 wafers 200 are arranged in the boat 217, with a space provided therebetween. The boat 217 is made of a heat-resisting material such as quartz and SiC. A insulating plate 218 is made of a heat resisting material such as quartz and SiC, and installed in multi-stages under the boat 217. This configuration makes it difficult to transmit heat from a heater 207 to the seal cap 219. The present embodiment is not limited to the above-described configuration. For example, the heat insulating plate 218 may not be installed under the boat 217, but a heat insulating cylinder may installed under the boat 217, the heat insulating cylinder being a cylindrical member made of a heat resisting material such as quartz and SiC.

A temperature sensor 263 serving as a temperature detector is installed in the reaction tube 203. The state of electricity conducted to the heater 207 is adjusted based on the temperature information detected by the temperature sensor 263, such that the internal temperature of the process chamber 201 has a desired temperature distribution. The temperature sensor 263 is L-shaped like the nozzles 249a and 249b, and installed along the inner wall of the reaction tube 203.

Figure 3:
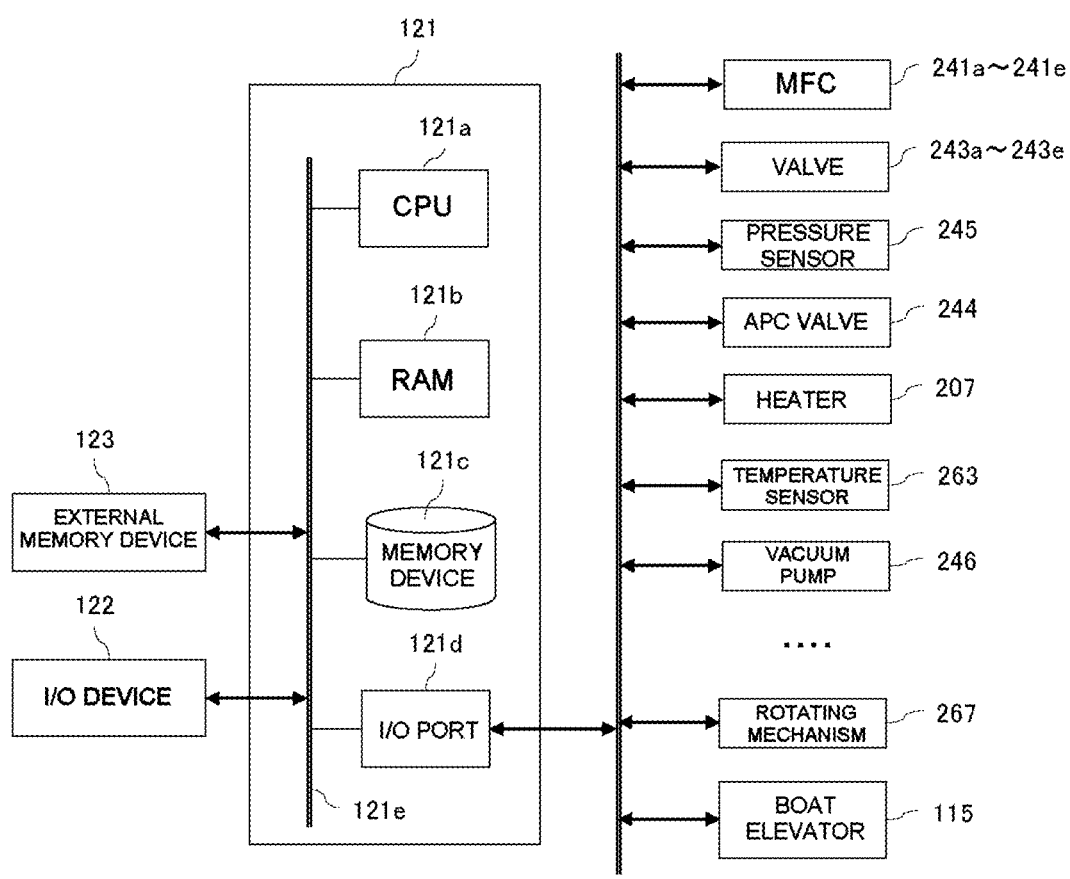
FIG. 3 is a diagram illustrating a configuration of a controller in the substrate processing apparatus which is used in the embodiment described herein, showing a block diagram of a control system of the controller.

As illustrated in FIG. 3, a controller 121 serving as a control unit is embodied by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an I/O device 122 such as a touch panel is connected to the controller 121.

The memory device 121c is embodied by components such as a flash memory and HDD (Hard Disk Drive). A control program for controlling the operation of the substrate processing apparatus or a process recipe having information on the sequence and conditions of the substrate processing described later is readably stored in the memory device 121c. The process recipe is created in such a manner that the controller 121 executes steps of the substrate processing described later in order to acquire a predetermined result, and functions as a program. Hereafter, the process recipe and the control program are also collectively referred to as a program. In this specification, "program" may indicate only the process recipe, indicate only the control program, or indicate both of them. Furthermore, "program" may include only the process recipe or control program or include both of them. The RAM 121b is a work area where a program or data read by the CPU 121a is temporarily retained.

The I/O port 121d is connected to the above-described components such as the MFCs 241a through 241e, the valves 243a through 243e, the pressure sensor 245, the APC valve 244, the heater 207, the temperature sensor 263, the rotating mechanism 267 and the boat elevator 115.

The CPU 121a is configured to read a control program read from the memory device 121c and execute the read control program. Furthermore, the CPU 260a is configured to read a process recipe from the memory device 121c according to an instruction such as an operation command inputted from the I/O device 122. According to the contents of the read process recipe, the CPU 121a may control various operations such as flow rate adjusting operations for various gases by the MFCs 241a through 241e, opening/closing operations of the valves 243a through 243e, an opening/closing operation of the APC valve 244, a pressure adjusting operation by the APC valve 244 based on the pressure sensor 245, a start and suspension of the vacuum pump 246, a temperature adjusting operation of the heater 207 based on the temperature sensor 263, a rotation and rotation speed adjusting operation of the boat 217 by the rotating mechanism 267, and an elevating operation of the boat 217 by the boat elevator 115.

The controller 121 is not limited to the case that the controller 121 is embodied by a dedicated computer. For example, the controller 121 may be embodied by a general use computer. The controller 121 according to the present embodiment may be embodied by preparing an external memory device 123 storing the above-described program therein and installing the program in a general use computer using the external memory device 123. The external memory device 123 may include a magnetic disk such as a magnetic tape, flexible disk and hard disk, an optical disk such as CD and DVD, a magneto-optical disk such as MO, and a semiconductor memory such as a USB memory and memory card. However, the unit for supplying the program to the computer is not limited to the configuration for supplying the program through the external memory device 123. For example, the program may be directly supplied through a communication unit such as the Internet and dedicated line, without the external memory device 123. The memory device 121c or the external memory device 123 is embodied by a transitory computer readable recording medium. Hereafter, they are collectively referred to as recording media. In this specification, "recording media" may indicate only the memory device 121c, indicate only the external memory device 123, and indicate both of the memory device 121c and the external memory device 123.

(2) Substrate Processing

An example of a sequence for forming a film on a substrate using the above-described substrate processing apparatus will be described as one of semiconductor device manufacturing processes, with reference to FIG. 4. In the following descriptions, the controller 121 controls the components constituting the substrate processing apparatus.

Figure 4:
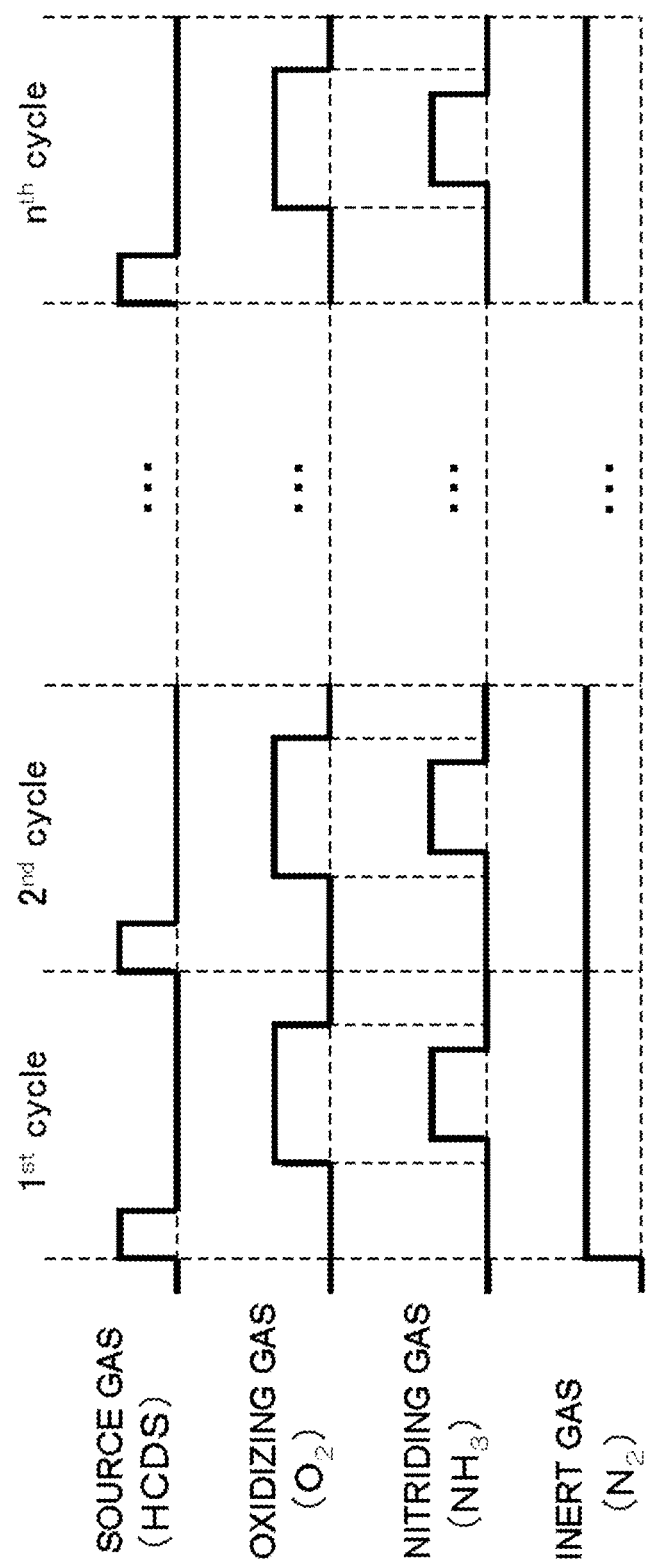
FIG. 4 is a diagram illustrating timings at which gases are supplied in a film-forming sequence according to the embodiment described herein.

According to the film-forming sequence illustrated in FIG. 4, a cycle including steps 1 and 2 which are performed non-simultaneously is performed a predetermined number of times (one or more times) to form a silicon oxynitride (SiON) film on the wafer 200. The step 1 includes supplying HCDS gas to the wafer 200 via the nozzle 249a, and the step 2 includes supplying $NH_3$ gas and $O_2$ gas to the wafer 200 via the nozzle 249b.

The step 2 of supplying $NH_3$ gas and $O_2$ gas includes a sub-step of supplying $O_2$ gas while suspending the supply of $NH_3$ gas, and a sub-step of simultaneously supplying $NH_3$ gas and O2 gas. The sub-steps are consecutively performed.

Specifically, a sub-step 2a of supplying O₂ gas before supplying NH₃ gas, a sub-step 2b of simultaneously supplying NH₃ gas and O₂ gas, and a sub-step 2c of supplying O₂ gas after suspending the supply of NH₃ gas are sequentially and consecutively performed.

In this specification, the above-described film-forming sequence is expressed as follows, for convenience of description.

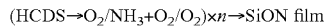

(HCDS→O₂/NH₃+O₂/O₂)×n→SiON film

In this specification, "wafer" may indicate "a wafer itself" or indicate "a stacked body (aggregate body) of a wafer and a predetermined layer or film formed on the surface thereof". That is, the wafer and the predetermined layer or film formed on the surface thereof may be collectively referred to as the wafer. In this specification, "surface of wafer" indicates "a surface (exposed surface) of a wafer" or "the surface of a predetermined layer or film formed on the wafer, i.e. the top surface of the wafer as a stacked body".

Thus, in this specification, "supplying a predetermined gas to a wafer" may indicate "directly supplying the predetermined gas to a surface (exposed surface) of the wafer", or indicate "supplying the predetermined gas to a layer or film formed on the wafer, i.e. the top surface of the wafer as a stacked body". In this specification, "forming a predetermined film or layer on a wafer" may indicate "directly forming the predetermined film or layer on a surface (exposed surface) of the wafer", or indicate "forming the predetermined film or layer on a film or layer formed on the wafer, i.e. the top surface of the wafer as a stacked body".

In this specification, the terms "substrate" and "wafer" may be used as the same meaning. When the term "substrate" is used, "wafer" may be replaced with "substrate" in the above descriptions.

<Wafer Charging and Boat Loading>

The boat 217 is charged with the wafers 200 (wafer charging). Then, as illustrated in FIG. 1, the boat 217 charged with the wafers 200 is lifted by the boat elevator 115 and loaded into the process chamber 201 (boat loading). The seal cap 219 seals the lower end of the reaction tube 203 with the O-ring 220 provided therebetween.

<Pressure Adjusting and Temperature Adjusting>

The vacuum pump 246 vacuum-exhausts (decompression-exhausts) the process chamber 201 such that the inner pressure of the process chamber 201, that is, the pressure of the space in which the wafers 200 are present satisfies a desired pressure (vacuum degree). At this time, the inner pressure of the process chamber 201 is measured by the pressure sensor 245, and the APC valve 244 is feedback controlled based on the measured pressure information. The vacuum pump 246 is continuously operated until at least the process for the wafer 200 is ended. Until the temperature of the wafer 200 in the process chamber 201 reaches a desired film-forming temperature, the heater 207 heats the process chamber 201. Until the inner temperature of the process chamber 201 satisfies a desired temperature distribution, the state of electricity conducted to the heater 207 is feedback controlled based on the temperature information detected by the temperature sensor 263. The heater 207 continuously heats the process chamber 201 until at least the process for the wafer 200 is ended. The rotating mechanism 267 starts to rotate the boat 217 and the wafer 200. Until at least the process for the wafer 200 is ended, the rotating mechanism 267 continuously rotates the boat 217 and the wafer 200.

<SiON Film Forming Process>

Then, the next two steps, that is, the steps 1 and 2 are sequentially performed.

<Step 1>

<HCDS Gas Supply>

At this step, HCDS gas is supplied to the wafer 200 in the process chamber 201.

Specifically, the valve 243a is opened to supply HCDS gas into the gas supply pipe 232a. While the flow rate of HCDS gas is adjusted by the MFC 241a, the HCDS gas is supplied into the process chamber 201 via the nozzle 249a and exhausted through the exhaust pipe 231. In this way, the HCDS gas is supplied to the wafer 200. Simultaneously, the valve 243d is opened to supply N₂ gas into the gas supply pipe 232d. The N₂ gas having the flow rate thereof adjusted by the MFC 241d is supplied into the process chamber 201 with the HCDS gas, and exhausted through the exhaust pipe 231.

In order to prevent HCDS gas from permeating into the nozzle 249b, the valve 243e is opened to supply N₂ gas into the gas supply pipe 232e. The N₂ gas is supplied into the process chamber 201 via the gas supply pipe 232b and the nozzle 249b, and exhausted through the exhaust pipe 231.

The flow rate of the supplied HCDS gas is adjusted by the MFC 241a to range from 1 sccm to 2,000 sccm, preferably, from 10 sccm to 1,000 sccm. The flow rate of the supplied N₂ gas is adjusted by the MFCs 241d and 241e to range from 100 sccm to 10,000 sccm. The internal pressure of the process chamber 201 ranges from 1 Pa to 2,666 Pa, preferably, from 67 Pa to 1,333 Pa. The time period during which HCDS gas is supplied to the wafer 200, i.e. the gas supply time (gas irradiation time) ranges from 1 second to 120 seconds, preferably, from 1 second to 60 seconds. The temperature of the heater 207 is set so that the temperature of the wafer 200 ranges from 250° C. to 700° C., preferably from 300° C. to 650° C., or more preferably from 350° C. to 600° C.

When the temperature of the wafer 200 is less than 250° C., HCDS is difficult to chemically adsorb on the wafer 200. Therefore, a practical film-forming speed cannot be acquired. The temperature of the wafer 200 may be raised to 250° C. or higher, in order to acquire a practical film-forming speed. The temperature of the wafer 200 may be raised to 300° C. or higher or desirably 350° C. or higher, such that HCDS can sufficiently adsorb on the wafer 200. Therefore, a more sufficient film-forming speed can be obtained.

When the temperature of the wafer 200 exceeds 700° C., CVD reaction may become too strong (excessive gas phase reaction may occur), which makes it easy to degrade the uniformity of the film thickness. Therefore, it is difficult to control the uniformity of the film thickness. When the temperature of the wafer 200 is lowered to 700° C. or lower, a proper gas phase reaction may occur, which makes it possible to suppress a degradation in uniformity of the film thickness. Therefore, it is possible to easily control the uniformity of the film thickness. When the temperature of the wafer 200 is lowered to 650° C. or lower or desirably 600° C. or lower, a surface reaction prevails more than the gas phase reaction, which makes it easy to control the uniformity of the film thickness. Therefore, it is possible to easily control the uniformity of the film thickness.

Therefore, the temperature of the wafer 200 ranges from 250° C. to 700° C., preferably 300° C. to 650° C., or more preferably 350° C. to 600° C.

By supplying HCDS gas to the wafer 200 according to the above-described condition, a Si-containing layer containing chlorine (Cl) with a thickness of one atomic layer to several atomic layers is formed as a first layer on the top surface of the wafer 200. The Si-containing layer containing Cl may include a Si layer containing Cl, an adsorption layer of HCDS or both of them.

The Si layer containing Cl may include a continuous layer made of Si and containing Cl, a discontinuous layer made of Si and containing Cl, and a Si thin film containing Cl in which the continuous layer and the discontinuous layer overlap each other. The continuous layer made of Si and containing Cl may be referred to as a Si thin film containing Cl. The bond between Si constituting the Si layer containing Cl and Cl may be completely cleaved or not completely cleaved.

The adsorption layer of HCDS includes not only a continuous adsorption layer constituted by HCDS molecules, but also a discontinuous adsorption layer. That is, the adsorption layer of HCDS includes one modular layer constituted by HCDS molecules or an adsorption layer having a thickness of less than one molecular layer. The HCDS molecules constituting the adsorption layer of HCDS also include molecules in which the bond between Si and Cl is partially cleaved. That is, the adsorption layer of HCDS may include a physical adsorption layer of HCDS, a chemical adsorption layer of HCDS or both of them.

In this specification, "layer having thickness of less than one atomic layer" indicates an atomic layer which is discontinuously formed, and "layer having thickness of one atomic layer" indicates an atomic layer which is continuously formed. Moreover, "layer having thickness of less than one molecular layer" indicates a molecular layer which is discontinuously formed, and "layer having thickness of one molecular layer" indicates a molecular layer which is continuously formed. The Si-containing layer containing Cl may include both of a Si layer containing Cl and an adsorption layer of HCDS. As described above, however, expressions such as "one atomic layer" and "several atomic layers" may be used for the Si-containing layer containing Cl.

Under the condition that HCDS gas self-decomposes (thermally decomposes), that is, the condition that a thermal decomposition of HCDS gas occurs, the Si-containing layer containing Cl is formed through deposition of Si on the wafer 200. Under the condition that HCDS gas does not self-decompose (thermally decompose), that is, the condition that a thermal decomposition of HCDS gas does not, the adsorption layer of HCDS is formed through adsorption of HCDS on the wafer 200. When the Si layer containing Cl is formed on the wafer 200, a higher deposition rate can be obtained than when the adsorption layer of HCDS is formed on the wafer 200.

When the thickness of the first layer exceeds a thickness of several atomic layer, a modification of the step 2 described later is not transferred to the entire part of the first layer. The thickness of the first layer has a minimum value of less than one atomic layer. Therefore, the thickness of the first layer ranges from one atomic layer to several atomic layers. By setting the thickness of the first layer to a thickness equal to or less than one atomic layer, the effect of the modification reaction of the step 2 described layer can be relatively improved, and the time required for the modification reaction of the step 2 can be shortened. Furthermore, the time required for forming the first layer at the step 1 can be shortened. As a result, the process time per one cycle can be shortened, which makes it possible to shorten the total process time. That is, the deposition rate can be improved.

By setting the thickness of the first layer to a thickness equal to or less than one atomic layer, the uniformity of the film thickness can be more easily controlled.

<Residual Gas Removal>

After the first layer is formed, the valve 243a is closed to suspend the supply of HCDS gas. While maintaining the APC valve 244 in an open state, the vacuum pump 246 vacuum-exhausts the process chamber 201, thereby removing residual HCDS gas which did not react or had contributed to forming the first layer, from the process chamber 201. At this time, by maintaining the valves 243d and 243e in an open state, $N_2$ gas is continuously supplied into the process chamber 201. The $N_2$ gas serves as a purge gas. By continuously supplying the $N_2$ gas, the gas remaining in the process chamber 201 can be more effectively removed from the process chamber 201.

At this time, the gas remaining in the process chamber 201 may not be completely removed, and the inside of the process chamber 201 may not be completely purged. When a small amount of gas remains in the process chamber 201, adverse effects on the subsequent step 2 do not occur. The flow rate of $N_2$ gas supplied into the process chamber 201 does not need to be raised. For example, by supplying the same amount of $N_2$ gas as the volume of the reaction tube 203 (process chamber 201), purge can be performed to such an extent that adverse effects on the step 2 do not occur. Since the inside of the process chamber 201 is not completely purged, the purge time can be shortened while throughput is improved. Furthermore, the consumption of $N_2$ gas can be suppressed to the minimum.

In addition to HCDS gas, an inorganic source gas or organic source gas may be used as the source gas. The inorganic source gas may include dichlorosilane ($SiH_2Cl_2$, abbreviated to DCS) gas, monochlorosilane ($SiH_3Cl$, abbreviated to MCS) gas, tetrachlorosilane, i.e. silicon tetrachloride ($SiCl_4$, abbreviated to STC) gas, trichlorosilane (SiHCl$_3$, abbreviated to TCS) gas, trisilane ($Si_3H_8$, abbreviated to TS) gas and disilane ($Si_2H_6$, abbreviated to DS) gas, and the organic source gas may include tetrakis(dimethylamino) silane ($Si[N(CH_3)_2]_4$, abbreviated to 4DMAS) gas, tris(dimethylamino)silane ($Si[N(CH_3)_2]_3H$, abbreviated to 3DMAS) gas, bis(diethylamino)silane ($Si[N(C_2H_5)_2]_2H_2$, abbreviated to BDEAS) and bis(tertiary-butylamino)silane ($SiH_2[NH(C_4H_9)]_2$, abbreviated to BTBAS).

In addition to $N_2$ gas, rare gases such as argon (Ar) gas, helium (He) gas, neon (Ne) gas and xenon (Xe) gas may be used as the inert gas.

<Step 2>

($NH_3$ gas and $O_2$ gas supply)

After the step 1 is ended, the above-described sub-steps 2a through 2c are sequentially performed to supply $NH_3$ gas and $O_2$ gas, activated by heat, to the wafer 200 in the process chamber 201.

At the sub-step 2a, $O_2$ gas is supplied before $NH_3$ gas is supplied. At the sub-step 2a, with the valve 243c closed, the valves 243b, 243d and 243e are controlled to be opened/closed in the same sequence as the opening/closing control for the valves 243a, 243d and 243e at the step 1. The $O_2$ gas is supplied into the process chamber 201 via the gas supply pipe 232b and the nozzle 249b, and exhausted through the exhaust pipe 231. Therefore, the $O_2$ gas serving as a reaction gas is exclusively supplied to the wafer 200.

At the sub-step 2b, $NH_3$ gas and $O_2$ gas are simultaneously supplied. At the sub-step 2b, the valve 243c is opened with the valves 243b, 243d and 243e open. That is, while the $O_2$ gas is continuously supplied, the supply of $NH_3$ gas is started. The $NH_3$ gas is mixed with the $O_2$ gas in the gas supply pipe 232b, supplied into the process chamber 201 via the nozzle 249b, and exhausted through the exhaust pipe 231. In this way, the gas mixture of $O_2$ gas and $NH_3$ gas is supplied as a reaction gas to the wafer 200. Hereafter, the gas mixture of $O_2$ gas and $NH_3$ will be simply referred to as a gas mixture or "$NH_3$ gas+$O_2$ gas".

At the sub-step 2c, $O_2$ gas is supplied after the supply of $NH_3$ gas is suspended. At the sub-step 2c, the valve 243c is closed with the valves 243b, 243d and 243e open. That is, while the $O_2$ gas is continuously supplied, the supply of $NH_3$ gas is suspended. As in the sub-step 2a, the $O_2$ gas is supplied into the process chamber 201 via the gas supply pipe 232b and the nozzle 249b, and exhausted through the exhaust pipe 231. Thus, the $O_2$ gas is exclusively supplied as a reaction gas to the wafer 200.

Those sub-steps 2a through 2c are consecutively performed. That is, another step such as a step of removing a residual gas in the process chamber 201 is not performed between the sub-steps 2a and 2b and between the sub-steps 2b and 2c, but the sub-steps 2a through 2c are consecutively performed.

The flow rate of $O_2$ gas supplied at the sub-steps 2a through 2c is controlled by the MFC 241b to range from 100 sccm to 10,000 sccm. The flow rate of $NH_3$ gas supplied at the sub-step 2b is controlled by the MFC 241c to range from 100 sccm to 10,000 sccm.

The inner pressure of the process chamber 201 at the sub-steps 2a through 2c ranges from 1 Pa to 4,000 Pa, preferably from 1 Pa to 3,000 Pa. The partial pressure of the gas mixture ($NH_3$ gas+$O_2$ gas) in the process chamber 201 at the sub-steps 2a through 2c ranges from 0.01 Pa to 3,950 Pa. By setting the inner pressure of the process chamber 201 in such a relatively high pressure range at the sub-steps 2a through 2c, $NH_3$ gas or $O_2$ gas can be thermally activated without plasma. When the $O_2$ gas or $NH_3$ gas is thermally activated and supplied, a relatively soft chemical reaction may occur. Therefore, modification described later may be performed in a relatively soft manner.

At the sub-step 2a, a time required for exclusively supplying the thermally activated $O_2$ gas as a reaction gas to the wafer 200, that is, a gas supply time (gas irradiation time) ranges from 1 second to 15 seconds, more preferably from 1 second to 10 seconds. At the sub-step 2b, a time required for supplying the thermally activated gas mixture ($NH_3$ gas+$O_2$ gas) as a reaction gas to the wafer 200, that is, a gas supply time (gas irradiation time) ranges from 1 second to 120 seconds, more preferably from 1 second to 60 seconds. At the sub-step 2c, a time required for exclusively supplying the thermally activated $O_2$ gas as a reaction gas to the wafer 200, that is, a gas supply time (gas irradiation time) ranges from 1 second to 30 seconds, more preferably from 1 second to 20 seconds.

The other processing conditions are the same as the processing conditions of the step 1, for example. The supply conditions of $O_2$ gas at the sub-steps 2a through 2c may be the same as each other or different from each other. For example, at least one of the flow rates and the gas supply times of $O_2$ gas at the sub-steps 2a through 2c may be differently set. The inner pressures in the process chamber 201 at the sub-steps 2a through 2c may also be different from each other.

By supplying $NH_3$ gas and $O_2$ gas to the wafer 200 according to the above-described conditions, the first layer formed on the wafer 200 reacts with the $NH_3$ gas and $O_2$ gas. Thus, the first layer may be modified.

Specifically, by supplying $O_2$ gas to the wafer 200 before starting the supply of $NH_3$ gas at the sub-step 2a, oxygen contained in the $O_2$ gas may be supplied to the first layer. Therefore, the first layer may be partially modified (oxidized). At the sub-step 2b, by simultaneously supplying $NH_3$ gas and $O_2$ gas to the wafer 200, nitrogen contained in the $NH_3$ gas and oxygen contained in the $O_2$ gas may be supplied to the first layer modified at the sub-step 2a. Therefore, the modified first layer may be at least partially modified (nitrided and oxidized). At the sub-step 2c, by continuously supplying the $O_2$ gas to the wafer 200 after suspending the supply of $NH_3$ gas, oxygen contained in the $O_2$ gas may be supplied to the first layer modified at the sub-step 2b. Therefore, the first layer modified at the sub-step 2b may be modified (reoxidized). At this time, a part of nitrogen contained in the first layer may be removed.

Thus, a second layer containing Si, O and N, that is, an oxynitride (SiON) layer (Si layer containing O and N) is formed on the wafer 200.

When the second layer is formed, Cl contained in the first layer constitutes at least a gaseous material containing Cl during the modification reaction process by $NH_3$ gas and $O_2$ gas, and is discharged from the process chamber 201. That is, impurities such as Cl in the first layer are removed from the first layer while extracted or desorbed from the first layer. Therefore, the amount of impurities such as Cl contained in the second layer is smaller than in the first layer.

<Residual Gas Removal>

After the second layer is formed, the valve 243b is closed to suspend the supply of $O_2$ gas, with the valve 243c closed or with the supply of $NH_3$ gas suspended. According to the same processing sequence as the step 1, residual $NH_3$ gas, $O_2$ gas and reaction byproducts which did not react or contributed to forming the second layer are removed from the process chamber 201. At this time, the gases remaining in the process chamber 201 may not be completely removed as in the step 1.

In addition to $NH_3$ gas, hydronitrogen-based gases such as diazen ($N_2H_2$) gas, hydrazine ($N_2H_4$) gas and $N_3H_8$ gas or a gas containing a compound thereof may be used as the nitriding gas.

In addition to $O_2$ gas, an O-containing gas may be used as the oxidizing gas, the O-containing gas including steam ($H_2O$ gas), nitrogen monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, a gas mixture of $H_2$ gas and $O_2$ gas and a gas mixture of $H_2$ gas and $O_3$ gas.

In addition to $N_2$ gas, rare gases such as argon (Ar) gas, helium (He) gas, neon (Ne) gas and xenon (Xe) gas may be used as the inert gas.

<Performing Predetermined Number of Times>

By performing a cycle one or more times (predetermined number of times), the cycle including the above-described steps 1 and 2 which are performed non-simultaneously, SiON film having a predetermined composition and thickness may be formed on the wafer 200. The above-described cycle may be repeated a plurality of times. That is, the thickness of the SiON film formed per one cycle may be set to a thickness smaller than a desired film thickness, and the above-described cycle may be repeated a plurality of times until the desired film thickness is obtained, in order to form the SiON film having a predetermined composition and thickness.

<Purge and Return to Atmospheric Pressure>

By opening the valves 243d and 243e, $N_2$ gas is supplied into the process chamber 201 through the gas supply pipes 232d and 232e, and exhausted through the exhaust pipe 231.

The N$_2$ gas serves as a purge gas. Thus, while the inside of the process chamber 201 is purged, gases or reaction byproducts remaining in the process chamber 201 are removed from the process chamber 201 (purge). Then, the inner atmosphere of the process chamber 201 is substituted with inert gas (inert gas substitution), and the inner pressure of the process chamber 201 returns to normal pressure (return to atmospheric pressure).

<Boat Unloading and Wafer Discharging>

As the seal cap 219 is moved downward by the boat elevator 115, the lower end of the reaction tube 203 is opened. Then, the processed wafer 200 supported on the boat 217 is unloaded to the outside of the reaction tube 203 through the lower end of the reaction tube 203 (boat unloading). The processed wafer 200 is discharged from the boat 217 (wafer discharging).

(3) Effects of Present Embodiment

According to the present embodiment, one or more effects described below can be obtained.

(a) At the step 2, NH$_3$ gas and O$_2$ gas are supplied through the nozzle 249b different from the nozzle 249a for supplying HCDS gas. At the step 2, NH$_3$ gas and O$_2$ gas are supplied through the same nozzle 249b. At the step 2, NH$_3$ gas and O$_2$ gas are simultaneously supplied. Such a configuration can suppress a production of particles in the nozzles 249a and 249b. Furthermore, the amount of particles produced in the process chamber 201 can be reduced. As a result, the quality of SiON film formed on the wafer 200 can be improved, while the cleaning frequency of the substrate processing apparatus is reduced.

The inventors of the present application have checked that, when NH$_3$ gas and O$_2$ gas were supplied through the nozzle 249a for supplying HCDS gas, particles were produced, and thus the amount of particles in the process chamber 201 was increased. For example, the inventors of the present application have checked that, when NH$_3$ gas or O$_2$ gas was supplied through the nozzle 249a during the step 2, the amount of particles in the process chamber 201 was increased.

The inventors of the present application have also checked that, when NH$_3$ gas and O$_2$ gas were simultaneously supplied through different nozzles at the step 2, a large amount of particles were produced, and thus the amount of particles in the process chamber 201 was increased. For example, the inventors of the present application have checked that, when a new nozzle different from the nozzles 249a and 249b was installed in the process chamber 201 and NH$_3$ gas and O$_2$ gas were supplied through the nozzle 249b and the new nozzle, respectively, during the step 2, a large amount of particles were produced, and thus the amount of particles in the process chamber 201 was increased.

The inventors of the present application have also checked that, when NH$_3$ gas and O$_2$ gas were not simultaneously supplied but sequentially supplied at the second step, the amount of particles in the process chamber 201 was increased. That is, the inventors of the present application have checked that, when the step of supplying NH$_3$ gas to the wafer 200 and the step of supplying O$_2$ gas to the wafer 200 were not simultaneously performed but non-simultaneously performed while NH$_3$ gas and O$_2$ gas were supplied to the wafer 200, a large amount of particles were produced, and thus the amount of particles in the process chamber 201 was increased. In particular, the inventors of the present application have checked that, when NH$_3$ gas was supplied before O$_2$ gas was supplied into the process chamber 201, a large amount of particles were produced, and thus the amount of particles in the process chamber 201 was significantly increased. Furthermore, the inventors of the present application have checked that, although NH$_3$ gas and O$_2$ gas were supplied through the same nozzle or separate nozzles when NH$_3$ gas and O$_2$ gas were sequentially supplied, the amount of particles in the process chamber 201 was increased.

As such, the inventors of the present application have checked that, although NH$_3$ gas or O$_2$ gas was supplied through the nozzle 249b different from the nozzle 249a for supplying HCDS gas, the amount of particles in the process chamber 201 was increased in case that O$_2$ gas did not flow in the nozzle 249b or the process chamber 201 but only NH$_3$ gas as a reaction gas exclusively flowed in the nozzle 249b or the process chamber 201, when NH$_3$ gas and O$_2$ gas were supplied.

The inventors of the present application have checked that, as the internal temperature of the process chamber 201 was raised during the film-forming process, the amount of particles in the process chamber 201 was increased. For example, the inventors of the present application have checked that, when the internal temperature of the process chamber 201 was as high as 700° C. during the film-forming process, the amount of particles was significantly increased in comparison to when the internal temperature of the process chamber 201 was 650° C.

On the contrary, according to the present embodiment, NH$_3$ gas and O$_2$ gas are simultaneously supplied through the nozzle 249b at the step 2. Therefore, it is possible to suppress NH$_3$ gas as a reaction gas from exclusively flowing in the nozzle 249b or the process chamber 201, while O$_2$ gas does not flow in the nozzle 249b or the process chamber 201. As a result, although the internal temperature of the process chamber 201 is as high as 700° C., the amount of particles in the process chamber 201 can be significantly reduced.

(b) At the step 2, the sub-steps 2a and 2c of supplying O$_2$ gas with the supply of NH$_3$ gas suspended and the sub-step 2b of simultaneously supplying NH$_3$ gas and O$_2$ gas are consecutively performed. Therefore, the amount of particles in the process chamber 201 can be further reduced.

The sub-step 2a of supplying O$_2$ gas before supplying NH$_3$ gas and the sub-step 2b of simultaneously supplying NH$_3$ gas and O$_2$ gas are consecutively performed without performing a step of removing a residual gas in the process chamber 201 therebetween. By consecutively performing the sub-steps 2a and 2b, it is possible to reliably prevent NH$_3$ gas as a reaction gas from exclusively flowing in the nozzle 249a or the process chamber 201 while O2 gas does not flow in the nozzle 249a or the process chamber 201. That is, when only the sub-step 2b is performed, O$_2$ gas may not flow in the nozzle 249b or the process chamber 201, but only NH$_3$ gas may exclusively flow through the nozzle 249b or the process chamber 201, in case that the valves 243b and 243c are opened at slightly different speeds or NH$_3$ gas and O$_2$ gas are diffused at slightly different speeds in the process chamber 201. However, by performing the sub-step 2a of first supplying O$_2$ gas before starting the sub-step 2b, it is possible to reliably suppress a risk that only NH$_3$ gas serving as a reaction gas may exclusively flow in the nozzle 249b or the process chamber 201. As a result, the above-described effect can be more reliably acquired.

The sub-step 2b of simultaneously supplying NH$_3$ gas and O$_2$ gas and the sub-step 2c of supplying O$_2$ gas after suspending the supply of NH$_3$ gas are consecutively performed without performing the step of removing a residual gas in the process chamber 201 therebetween. Therefore, it is possible to reliably prevent NH$_3$ gas as a reaction gas from exclusively flowing in the nozzle 249b or the process chamber 201 while O₂ gas does not flow in the nozzle 249b or the process chamber 201. When only the sub-step 2b is performed, O₂ gas may not flow in the nozzle 249b or the process chamber 201, but only NH₃ gas may exclusively flow in the nozzle 249b or the process chamber 201, in case that the valves 243b and 243c are opened at slightly different speeds or NH₃ gas and O₂ gas in the process chamber 201 are exhausted at slightly different speeds. However, by performing the sub-step 2c of continuously supplying O₂ gas after the sub-step 2b, it is possible to reliably suppress a risk that only NH₃ gas serving as a reaction gas may exclusively flow in the nozzle 249b or the process chamber 201. As a result, the above-described effect can be more reliably acquired.

(c) By performing the sub-steps 2a and 2c of supplying O₂ gas with the supply of NH₃ gas suspended, it is possible to more easily control the composition ratio of the finally formed SiON film than when only the sub-step 2b is performed.

For example, by performing the sub-step 2a of supplying O₂ gas before supplying NH₃ gas, at least a portion of the layer formed to this time, that is, the first layer (Si-containing layer containing Cl) formed at the step 1 may be first oxidized. Therefore, it is possible to suppress a nitridation of the first layer at the sub-step 2b of simultaneously supplying NH₃ gas and O₂ gas. As a result, the N concentration of the finally formed SiON film can be lowered. At least one of the supply conditions of O₂ gas at the sub-step 2a, for example, the gas supply time of O₂ gas, the flow rate of O₂ gas, the inner pressure of the process chamber 201 and the partial pressure of O₂ gas in the process chamber 201 may be adjusted to control the degree of oxidation performed at the sub-step 2a. As a result, the composition ratio (N concentration) of the finally formed SiON film can be precisely controlled.

For example, by supplying the sub-step 2c of supplying O₂ gas after suspending the supply of NH₃ gas, at least a portion of the layer from to this time, that is, the first layer (SiON layer) modified at the sub-step 2b may be reoxidized to desorb a portion of nitrogen contained in the first layer modified at the sub-step 2b. Therefore, the nitrogen concentration of the finally formed SiON film can be lowered. By adjusting at least any one of the supply conditions of O₂ gas at the sub-step 2c, for example, the gas supply time of O₂ gas, the flow rate of O₂ gas, the inner pressure of the process chamber 201 and the partial pressure of O₂ gas in the process chamber 201, the degree of nitrogen desorption at the sub-step 2c can be controlled. As a result, the composition ratio (nitrogen concentration) of the finally formed SiON film can be densely controlled.

(d) By non-simultaneously performing the steps 1 and 2, that is, non-simultaneously supplying the source gas and the reaction gas (oxidizing gas or nitriding gas) without simultaneously supplying the source gas and the reaction gas, the gases may properly react with each other under the condition that a gas phase reaction or surface reaction properly occurs. As a result, the controllability for the step coverage and thickness of the finally formed SiON film can be improved. Therefore, it is possible to suppress an occurrence of particles while preventing an excessive gas phase reaction in the process chamber 201.

(e) The above-described effects can also be obtained when another gas in place of HCDS gas is used as the source gas, when an O-containing gas in place of O₂ gas is used as the oxidizing gas, or when a N-containing gas in place of NH₃ gas is used as the nitriding gas.

(4) Modifications

The film-forming sequence according to the present embodiment is not limited to that of FIG. 4. For example, the film-forming sequence may be modified according to the following modifications.

<First Modification>

Figure 5:
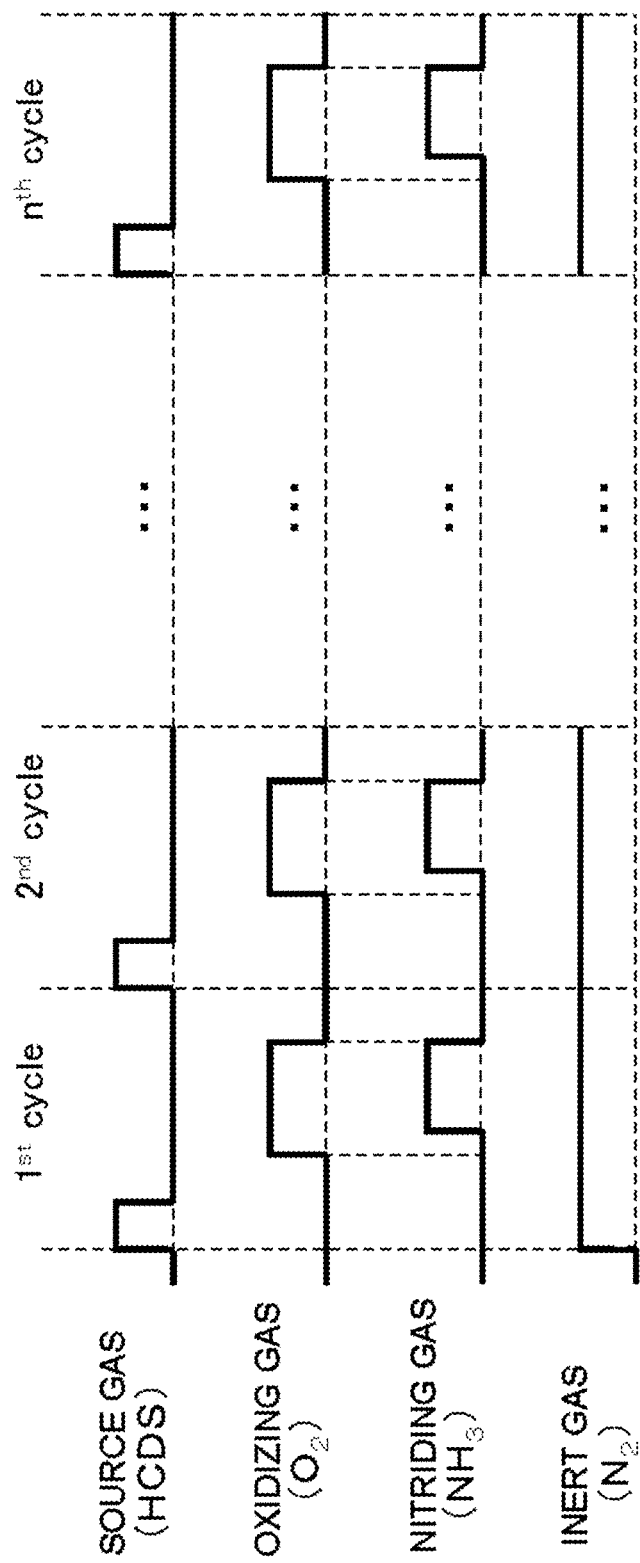
FIG. 5 is a diagram illustrating timings at which gases are supplied in a first modification of the film-forming sequence according to the embodiment described herein.

For example, as illustrated in FIG. 5, the sub-step 2c may not be performed after the sub-step 2b is performed. That is, when the modification of the first layer at the sub-step 2b, that is, the formation of the SiON film is completed, the valves 243b and 243c may be simultaneously closed to suspend the supply of NH₃ gas and the supply of O₂ gas at the same time.

This modification has the same effect as the film-forming sequence of FIG. 4. However, by performing both of the sub-steps 2a and 2c without performing only the sub-step 2a of the sub-steps 2a and 2c, it is possible to more reliably suppress a risk that only NH₃ gas as a reaction gas exclusively flows in the nozzle 249b or the process chamber 201. Therefore, both of the sub-steps 2a and 2c may be performed. When both of the sub-steps 2a and 2c are performed or only the sub-step 2c is performed as described later without performing only the sub-step 2a of the sub-steps 2a and 2c, the composition ratio of the finally formed SiON film can be easily controlled. Thus, both of the sub-steps 2a and 2c may be performed, or only the sub-step 2c may be performed as described above.

<Second Modification>

Figure 6:
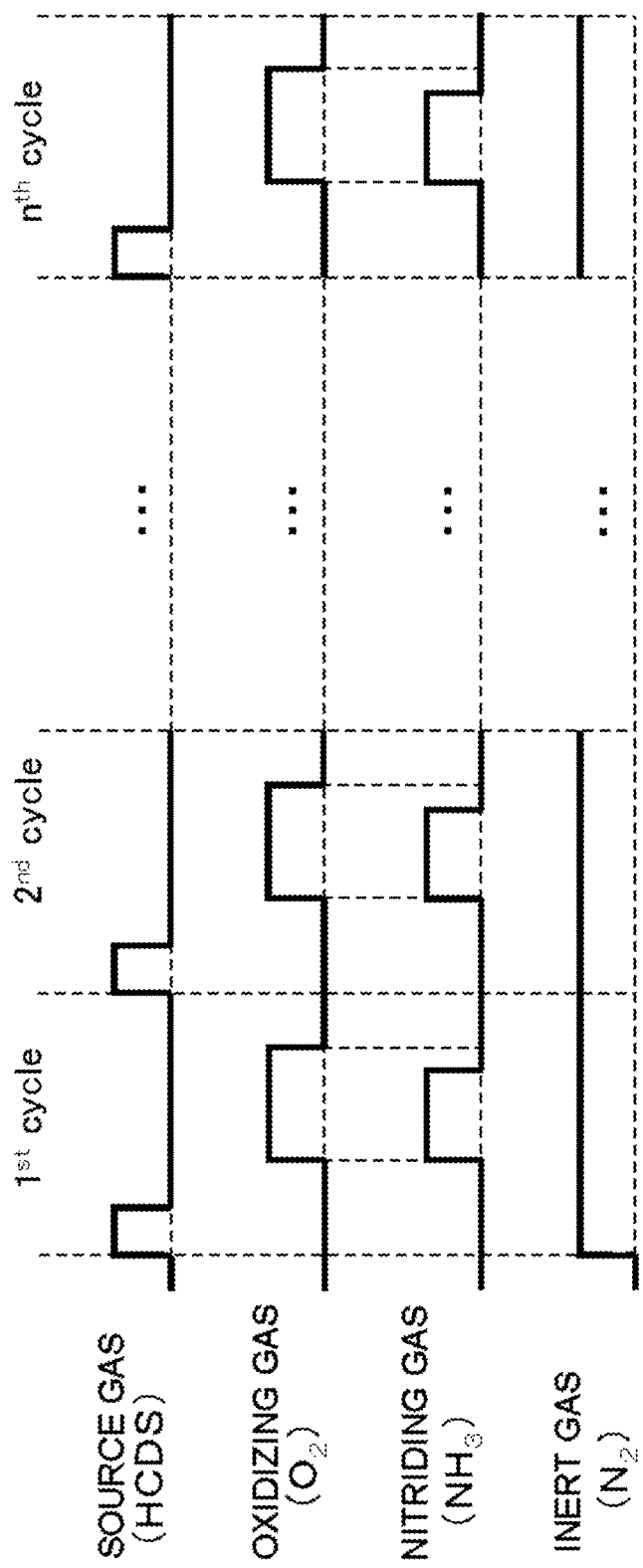
FIG. 6 is a diagram illustrating timings at which gases are supplied in a second modification of the film-forming sequence according to the embodiment described herein.

As illustrated in FIG. 6, the sub-step 2a may not be performed before the sub-step 2b is performed. That is, when the step 2 is started, the valves 243b and 243c may be simultaneously opened to start a supply of NH₃ gas and a supply of O₂ gas at the same time.

This modification has the same effect as the film-forming sequence of FIG. 4. However, when only the sub-step 2c of the sub-steps 2a and 2c is not performed, but both of the sub-steps 2a and 2c are performed, it is possible to more reliably suppress a risk that only NH₃ gas serving as a reaction gas exclusively flows in the nozzle 249b or the process chamber 201. Therefore, both of the sub-steps 2a and 2c may be performed. By performing both of the sub-steps 2a and 2c without performing only the sub-step 2c of the sub-steps 2a and 2c, it is possible to easily control the composition ratio of the finally formed SiON film. Therefore, both of the sub-steps 2a and 2c may be performed.

<Third Modification>

Figure 7:
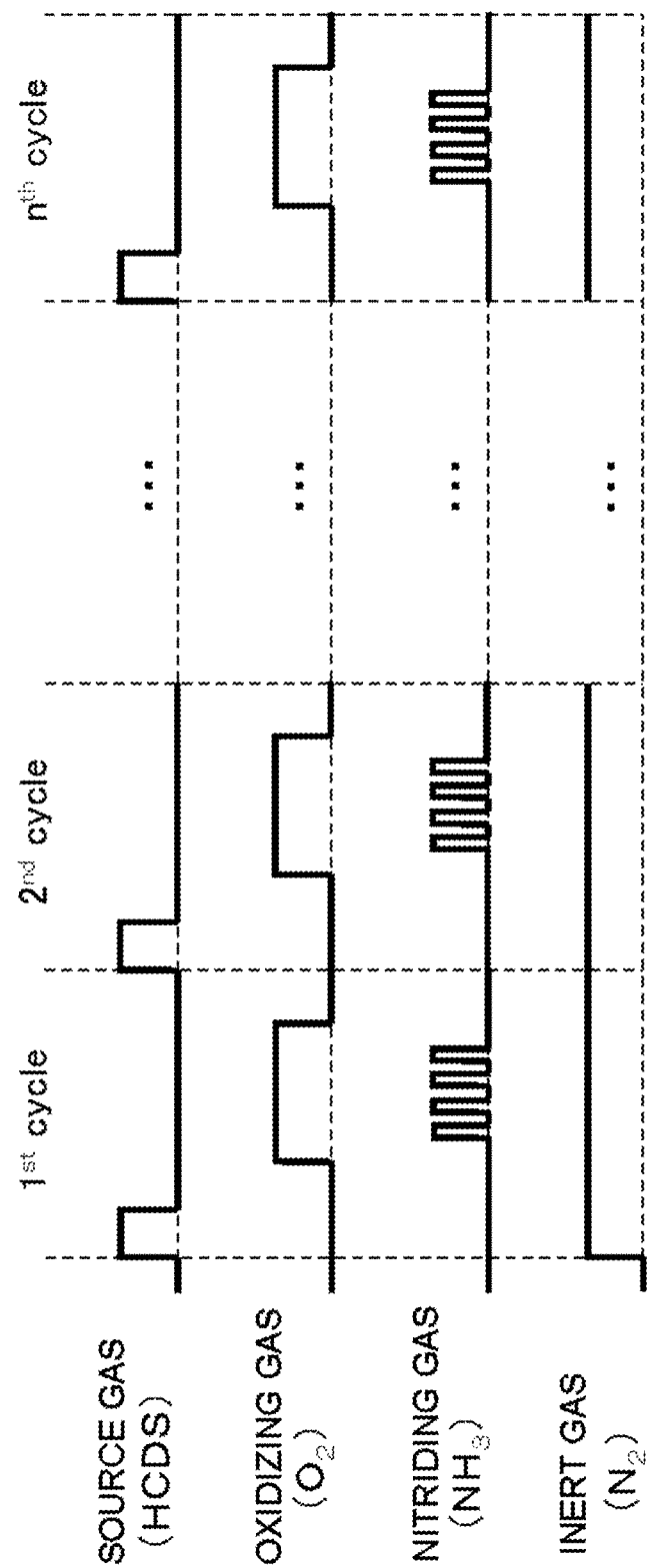
FIG. 7 is a diagram illustrating timings at which gases are supplied in a third modification of the film-forming sequence according to the embodiment described herein.

As illustrated in FIG. 7, NH₃ gas may be intermittently supplied a plurality of times when the sub-step 2b is performed. FIG. 7 illustrates an example in which NH₃ gas is intermittently supplied four times during the sub-step 2b.

This modification has the same effect as the film-forming sequence of FIG. 4. The number of times that the NH₃ gas is supplied at the sub-step 2b may be adjusted to control the degree of the nitridation performed at the sub-step 2b. As a result, the composition ratio (N concentration) of the finally formed SiON film can be more precisely controlled.

<Fourth Modification>

Figure 8:
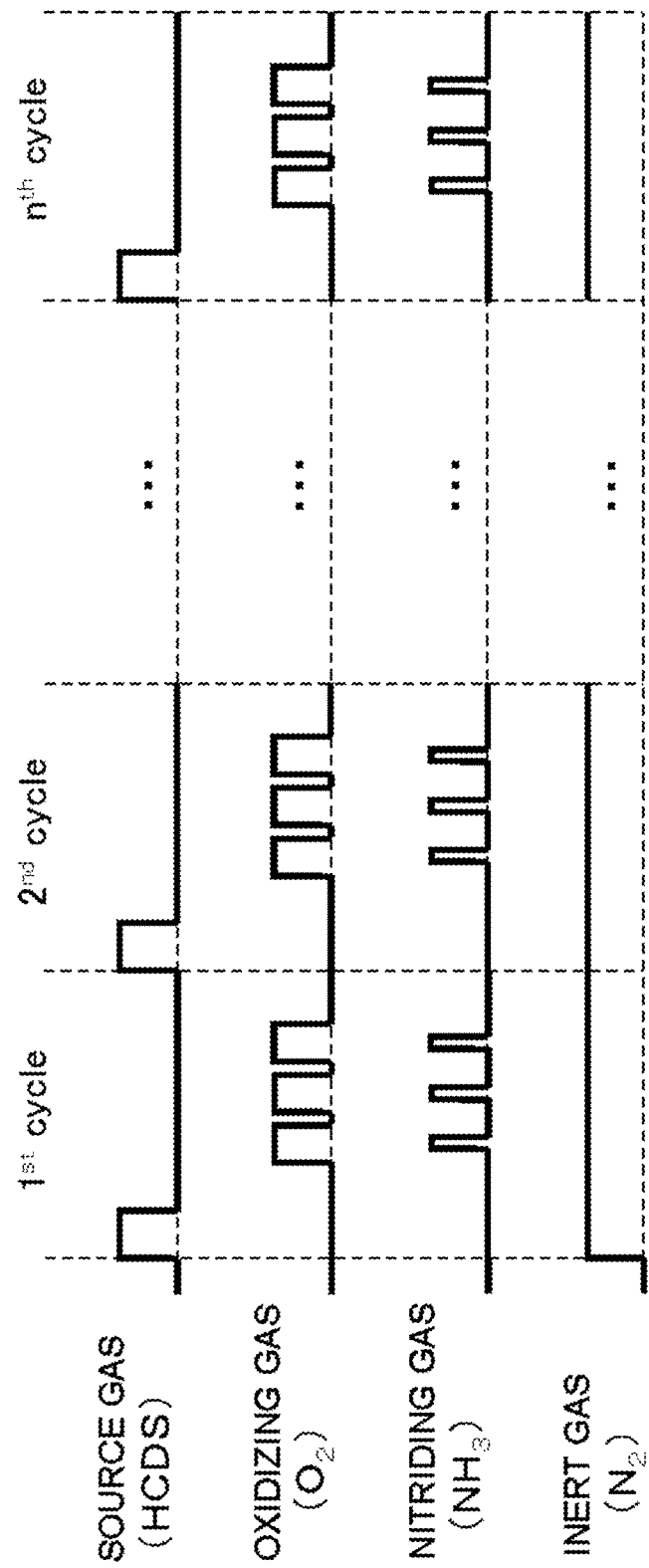
FIG. 8 is a diagram illustrating timings at which gases are supplied in a fourth modification of the film-forming sequence according to the embodiment described herein.

As illustrated in FIG. 8, a set of sequentially and consecutively performing the sub-steps from the sub-step 2a to the sub-step 2c at the step 2 may be repeated a plurality of times with the step of removing the residual gas in the process chamber 201 performed between the sets. FIG. 8 illustrates an example in which the set of sequentially and consecutively performing the sub-steps from the sub-step 2a to the sub-step 2c at the step 2 is performed three times with the step of removing the residual gas in the process chamber 201 performed between the respective sets. This modification has the same effect as the film-forming sequence of FIG. 4. By performing the step of removing the residual gas in the process chamber 201 whenever the above-described set is performed, it is possible to promote the discharge of particles from the process chamber 201 while further reducing the amount of particles in the process chamber 201. As a result, the quality of the SiON film formed on the wafer 200 can be further improved, while the cleaning frequency of the substrate processing apparatus is further reduced.

<Fifth to Eighth Modifications>

Figure 9:
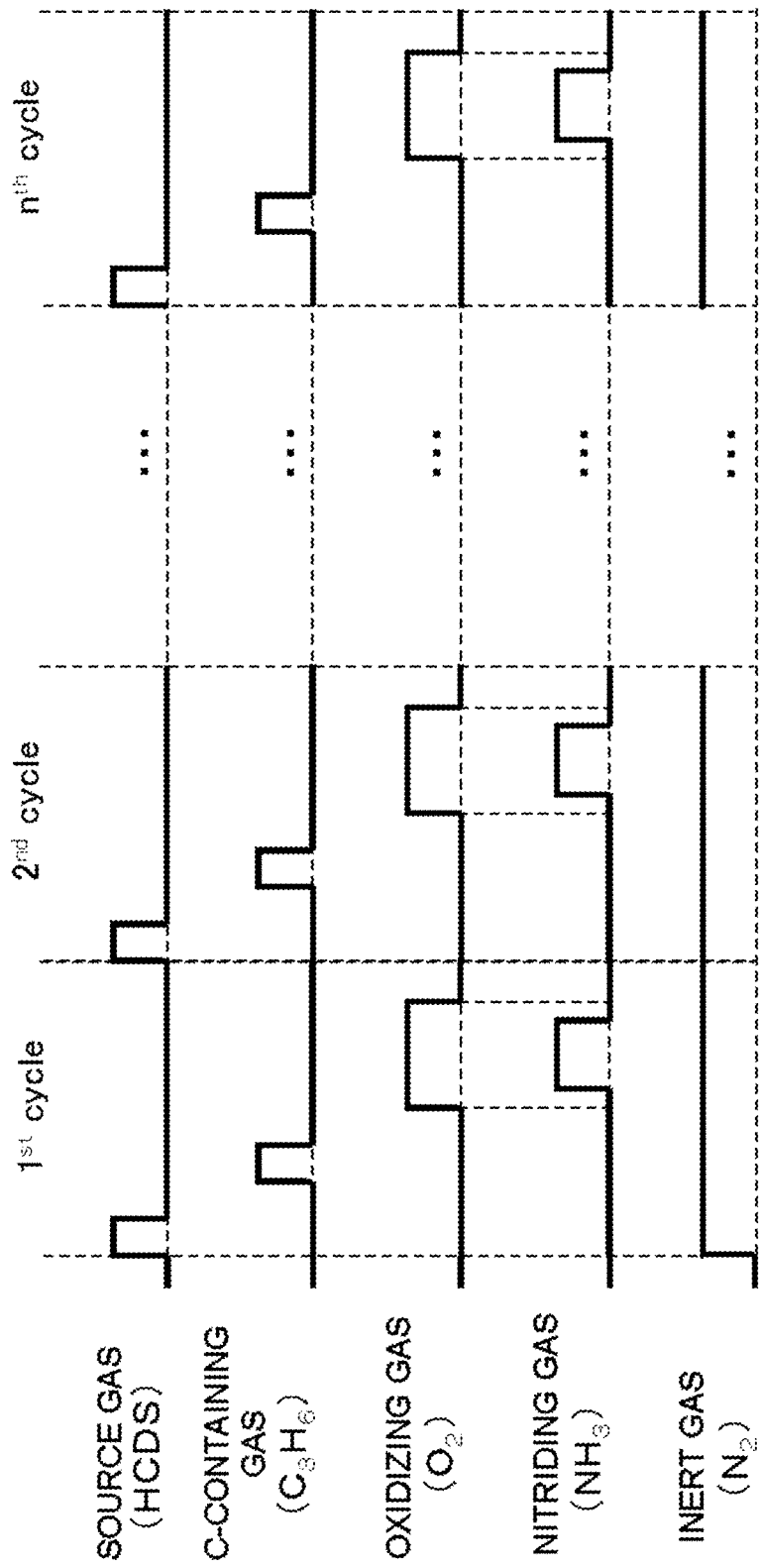
FIG. 9 is a diagram illustrating timings at which gases are supplied in a fifth modification of the film-forming sequence according to the embodiment described herein.

According to the following film-forming sequences in fifth to eighth modifications, a silicon oxycarbonitride (SiOCN) film and a boron-containing silicon oxycarbonitride (SiBOCN) film may be formed on the wafer 200. That is, the cycle including the steps 1 and 2 may further include a step of supplying a gas containing at least one of C and B to the wafer 200. FIG. 9 illustrates timings at which gases are supplied in the fifth modification. Instead of $C_3H_6$ gas, TEA gas may be supplied as the C source. Moreover, $C_3H_6$ gas and TEA gas may be simultaneously supplied as the C source. These modifications have the same effect as the film-forming sequence of FIG. 4. The seventh modification uses TMB gas as the B source. In the seventh modification, B is contained as one component of a borazine ring skeleton constituting a film. Therefore, the amount of B desorbed from the film by oxidation or the like in the seventh modification is smaller than in the eighth modification using $BCl_3$ gas as the B source. Furthermore, a film having high oxidation resistance may be formed. Therefore, the seventh modification is desirable than the eighth modification.

Fifth modification: $(HCDS \rightarrow C_3H_6 \rightarrow O_2/NH_3+O_2/O_2) \times n \rightarrow SiON$ film Sixth modification: $(HCDS \rightarrow TEA \rightarrow O_2/NH_3+O_2/O_2) \times n \rightarrow SiON$ film Seventh modification: $(HCDS \rightarrow TMB \rightarrow O_2/NH_3+O_2/O_2) \times n \rightarrow SiON$ film Eighth modification: $(HCDS \rightarrow C_3H_6 \rightarrow BCl3 \rightarrow O_2/NH_3+O_2/O_2) \times n \rightarrow SiBOCN$ film <Ninth Modification>

Figure 10:
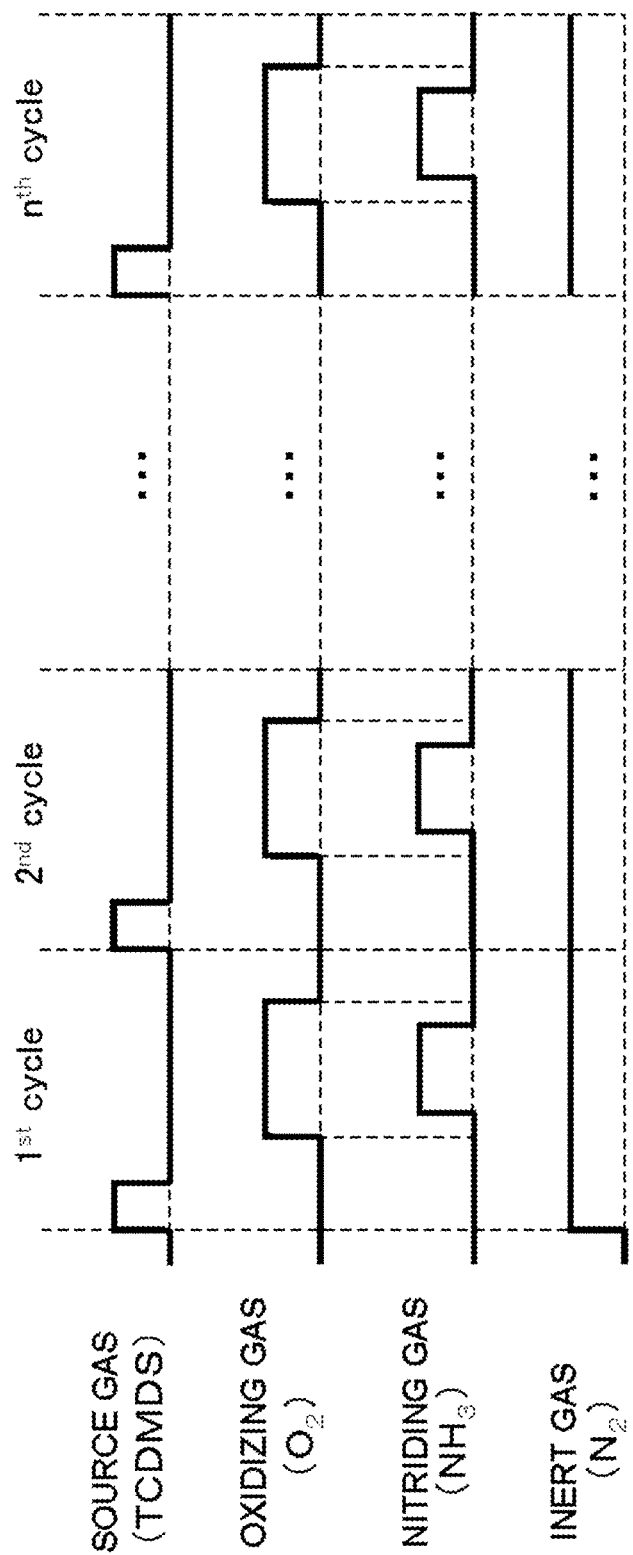
FIG. 10 is a diagram illustrating timings at which gases are supplied in a ninth modification of the film-forming sequence according to the embodiment described herein.

In addition to the above-described various silane source gases, an organic silane source gas may be used as the source gas, the organic silane source gas including an alkyl halosilane source gas such as 1,1,2,2-tetrachloro-1,2-dimethyldisilane $((CH_3)_2Si_2Cl_4$, abbreviated to TCDMDS) gas, an alkylene halosilane source gas such as bis(trichlorosilyl)methane $((SiCl_3)_2CH_2$, abbreviated to BTCSM) gas, and an alkylene silane source gas such as 1,4-disilanebutane $(Si_2C_2H_{10}$, abbreviated to DSB). That is, a silane source gas serving as the C source and having a chemical composition (one molecule) in which a Si—C bond is contained may be used as the source gas. Hereafter, the film-forming sequence in case that TCDMDS gas is used as the source gas is exemplified as the ninth modification. FIG. 10 illustrates timings at which gases are supplied in the ninth modification. This modification has the same effect as the film-forming sequence of FIG. 4.

$(TCDMDS \rightarrow O_2/NH_3+O_2/O_2) \times n \rightarrow SiON$ film

<Processing Conditions>

At the step of supplying $C_3H_6$ to the wafer 200 according to the above-described modifications, the flow rate of the supplied $C_3H_6$ gas is controlled by the MFC 241b to range from 100 sccm to 10,000 sccm. The inner pressure of the process chamber 201 ranges from 1 Pa to 5,000 Pa, desirably ranges from 1 Pa to 4,000 Pa. The partial pressure of $C_3H_6$ gas in the process chamber 201 ranges from 0.01 Pa to 4,950 Pa. The time period during which $C_3H_6$ gas is supplied to the wafer 200, that is, the gas supply time (gas irradiation time) ranges from 1 second to 200 seconds, preferably from 1 second to 120 seconds, or more preferably from 1 second to 60 seconds. The other processing conditions are the same as those of the step 2 in the film-forming sequence illustrated in FIG. 4. In addition to $C_3H_6$ gas, hydrocarbon-based gases such as acetylene ($C_2H_2$) gas and ethylene ($C_2H_4$) gas may be used as the C-containing gas.

At the step of supplying TEA gas to the wafer 200, the flow rate of the supplied TEA gas is controlled by the MFC 241b to range from 100 sccm to 10,000 sccm. The inner pressure of the process chamber 201 ranges from 1 Pa to 5,000 Pa, or desirably ranges from 1 Pa to 4,000 Pa. The partial pressure of TEA gas in the process chamber 201 ranges from 0.01 Pa to 4,950 Pa. The time period during which TEA gas is supplied to the wafer 200, that is, the gas supply time (gas irradiation time) ranges from 1 second to 200 seconds, preferably from 1 second to 120 seconds, or more preferably from 1 second to 60 seconds. The other processing conditions are the same as those of the step 2 in the film-forming sequence illustrated in FIG. 4. In addition to TEA gas, an ethylamine-based gas such as diethylamine $((C_2H_5)_2NH$, abbreviated to DEA) gas and monoethylamine $(C_2H_5NH_2$, abbreviated to MEA) gas and a methylamine-based gas such as trimethylamine $((CH_3)_3N$, abbreviated to TMA) gas, dimethylamine $((CH_3)_2NH$, abbreviated to DMA) gas and monomethylamine $(CH_3NH_2$, abbreviated to MMA) gas may be used as the N and C-containing gas.

At the step of supplying $BCl_3$ gas to the wafer 200, the flow rate of the supplied $BCl_3$ gas is controlled by the MFC 241b to range from 100 sccm to 10,000 sccm. The partial pressure of $BCl_3$ gas in the process chamber 201 ranges from 0.01 Pa to 2,640 Pa. The other processing conditions are the same as those of the step 1 in the film-forming sequence illustrated in FIG. 4. In addition to $BCl_3$ gas, gases such as monochloroborane ($BClH_2$) gas, dichloroborane ($BCl_2H$) gas, trifluoroborane ($BF_3$) gas, tribromoborane ($BBr_3$) gas and diborane ($B_2H_6$) gas may be used as the B-containing gas.

At the step of supplying TMB gas to the wafer 200, the flow rate of the supplied TMB gas is controlled by the MFC 241b to range from 100 sccm to 1,000 sccm. The partial pressure of TMB gas in the process chamber 201 ranges from 0.0001 Pa to 2,424 Pa. The other processing conditions are the same as those of the step 1 in the film-forming sequence illustrated in FIG. 4. In addition to TMB gas, TEB gas, TPB gas, TIPB gas, TBB gas and TIBB gas may be used as the B-containing gas containing a borazine ring skeleton.

The processing sequence and conditions at the other steps are the same as the processing sequence and conditions of the respective steps in the film-forming sequence illustrated in FIG. 4, for example.

Other Embodiments

So far, the various embodiments have been described in detail. However, the technique described herein is not limited to the above-described embodiments, but may be modified in various manners without departing from the scope thereof.

For example, the above-described embodiments are based on the example in which when an oxynitride film is formed, a reaction gas (oxidizing gas or nitriding gas) is supplied after a source gas is supplied. However, the technique described herein is not limited to such an example. For example, the source gas and the reaction gas may be supplied in the reverse order. That is, after the reaction gas is supplied, the source gas may be supplied. The sequence of supplying the gases may be changed to vary the quality or composition ratio of the formed thin film. When plural kinds of reaction gases are used, the sequence of supplying the reaction gases may be changed. The sequence of supplying the reaction gases may be changed to vary the quality or composition ratio of the formed thin film.

When the Si-based insulating film formed according to the film-forming sequence of FIG. 4 or the modifications is used as a sidewall spacer, for example, it is possible to provide a device forming technique which is capable of reducing a leak current while having an excellent processability. Furthermore, when the above-described Si-based insulating film is used as an etch stopper, it is possible to provide a device forming technique having an excellent processability. According to the film-forming sequence of FIG. 4 or the modifications, a Si-based insulating film having an ideal stoichiometric proportion can be formed without using plasma. Since the Si-based insulating film can be formed without using plasma, the described technique may be applied to a process in which plasma damage is likely to occur, as in a process of forming SADP film of DPT, for example.

The above-described film-forming sequences may be desirably applied even when an oxynitride film containing a metal element, that is, a metallic oxynitride is formed on the wafer 200, the metal element including titanium (Ti), zirconium (Zr), hafnium (Hf), tantalum (Ta), niobium (Nb), aluminum (Al), molybdenum (Mo) and tungsten (W).

That is, the described technique may be desirably applied even when forming a metallic oxynitride film such as TiON film, TiOCN film, TiBOCN film, ZrON film, ZrOCN film, ZrBOCN film, HfON film, HfOCN film, HfBOCN film, TaON film, TaOCN film, TaBOCN film, NbON film, NbOCN film, NbBOCN film, AlON film, AlOCN film, AlBOCN film, MoON film, MoOCN film, MoBOCN film, WON film, WOCN film and WBOCN film.

When a metallic oxynitride film is formed, a source gas containing a metal element may be used instead of the source gas containing a semiconductor element such as Si in the above-described embodiments. The same gas as in the above-described embodiments may be used as a reaction gas. When the metallic oxynitride film is formed, the same processing sequences and processing conditions as the above-described embodiments may be applied.

That is, the described technique may be desirably applied when forming an oxynitride film containing a predetermined element such as a semiconductor element and metal element.

A process recipe used for forming the various thin films (programs including information such as the processing sequence and conditions of substrate processing) may be separately prepared according to the contents of substrate processing, which include the kind, composition ratio, quality and thickness of a thin film to be formed and the processing sequence and conditions. That is, a plurality of process recipes may be prepared. When the substrate processing is started, a proper recipe among the plurality of recipes may be selected according to the contents of the substrate processing. Specifically, the plurality of recipes which are separately prepared according to the contents of the substrate processing may be previously stored (installed) in the memory device 121c installed in the substrate processing apparatus via an electrical communication line or a recording medium (external memory device 123) having the recipes written therein. Then, when substrate processing is started, the CPU 121a installed in the substrate processing apparatus may select a proper recipe among the plurality of recipes stored in the memory device 121c, according to the contents of the substrate processing. This configuration can universally and reproducibly form various kinds of thin films having various composition ratios, qualities and thicknesses, using one substrate processing apparatus. Furthermore, the configuration can reduce an operational burden of an operator when inputting a processing sequence and processing condition, and rapidly start substrate processing while avoiding an operation error.

The above-described process recipe is not limited to a new written recipe. For example, an existing recipe which is already installed in the substrate processing apparatus can be changed to a new recipe. When the existing recipe is changed to a new recipe, the new recipe may be installed in the substrate processing apparatus via an electrical communication line or a recording medium having the new recipe written therein. The I/O device 122 installed in the existing substrate processing apparatus may be operated to directly change the existing recipe which is already installed in the substrate processing apparatus.

The above-described embodiments have been based on the example in which a thin film is formed by a batch-type substrate processing apparatus capable of processing a plurality of substrates at a time. The described technique is not limited to the above-described embodiments. The described technique may also be desirably applied when forming a thin film using a single-wafer type substrate processing apparatus capable of processing one or more substrates at a time. The above-described embodiments have been based on the example in which a thin film is formed by a substrate processing apparatus including a hot wall-type processing furnace. The described technique is not limited to the above-described embodiments. For example, the described technique may also be desirably applied when forming a thin film using a substrate processing apparatus including a cold wall-type processing furnace. When the single-wafer type substrate processing apparatus is used or the substrate processing apparatus including a wall-type processing furnace is used, the same processing sequences and conditions as the above-described embodiments may be applied.

Figure 16:
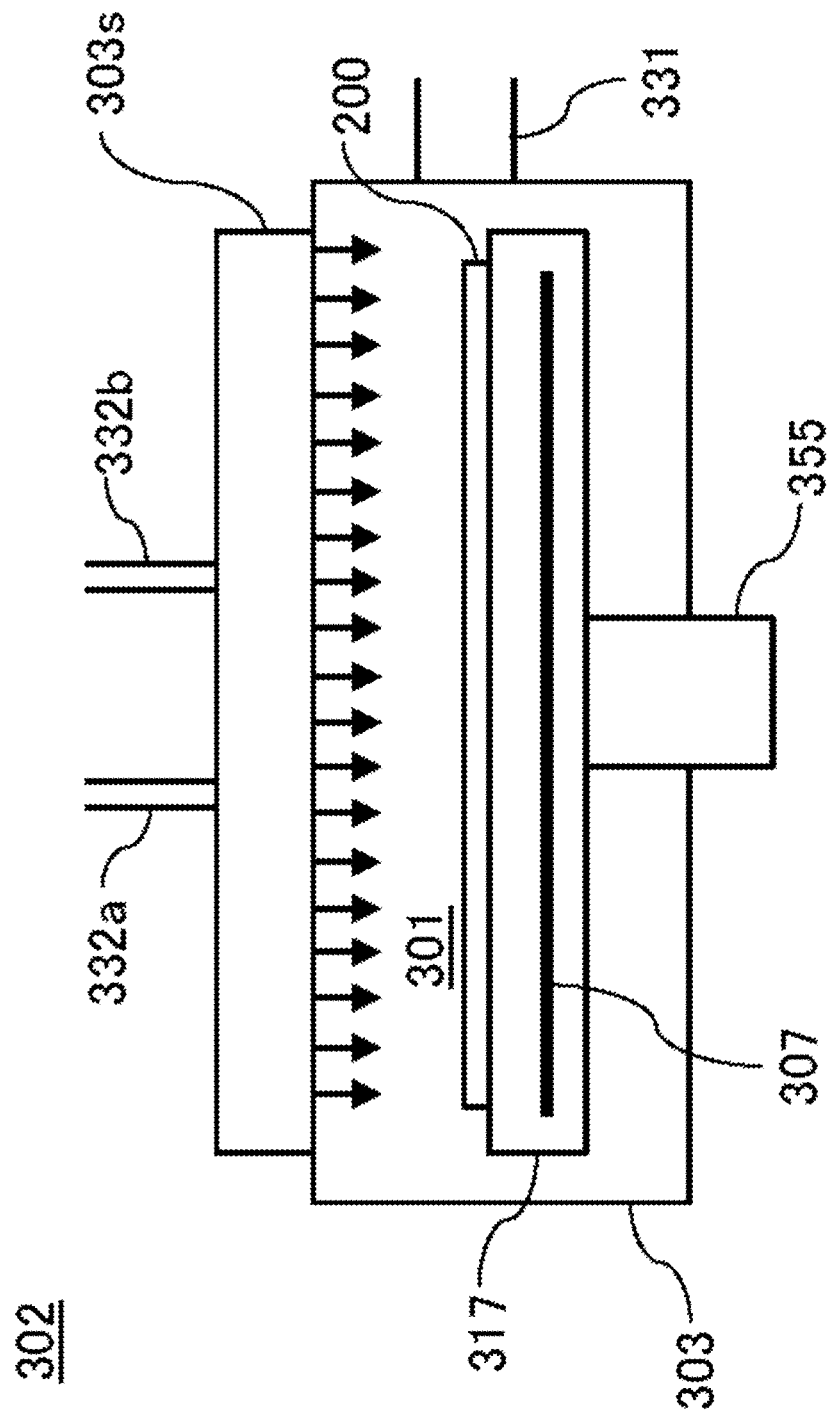
FIG. 16 is a diagram schematically illustrating a vertical processing furnace of a substrate processing apparatus which is used in another embodiment described herein, including a longitudinal sectional view of the processing furnace.

The described technique may also be desirably applied when forming a film using a substrate processing apparatus having a processing furnace 302 illustrated in FIG. 16, for example. The processing furnace 302 includes a processing container 303 having a process chamber 301 installed therein; a shower head 303s serving as a gas supply unit for supplying gas into the process chamber 301 like a shower; a support 317 supporting one or more wafers 200 in a horizontal position; a rotating shaft 355 supporting the support 317 from thereunder; and a heater 307 installed in the support 317. A gas supply port 332a for supplying the above-described source gas and a gas supply port 332b for supplying the above-described reaction gas is connected to an inlet (gas introduction port) of the shower head 303s. A gas supply system having substantially the same configuration as the source gas supply system according to the above-described embodiment is connected to the gas supply port 332a. A gas supply system having substantially the same configuration as the reaction gas supply system according to the above-described embodiment is connected to the gas supply port 332b. A gas dispersion plate for supplying gas into the process chamber 301 like a shower is installed at an outlet (gas discharge port) of the shower head 303s. The shower head 303s is installed at a location facing the surface of the wafer 200 loaded into the process chamber 301. An exhaust port 331 for exhausting the process chamber 301 is installed at the processing container 303. An exhaust system having the substantially the same configuration as the exhaust system according to the above-described embodiment is connected to the exhaust port 331.

Figure 17:
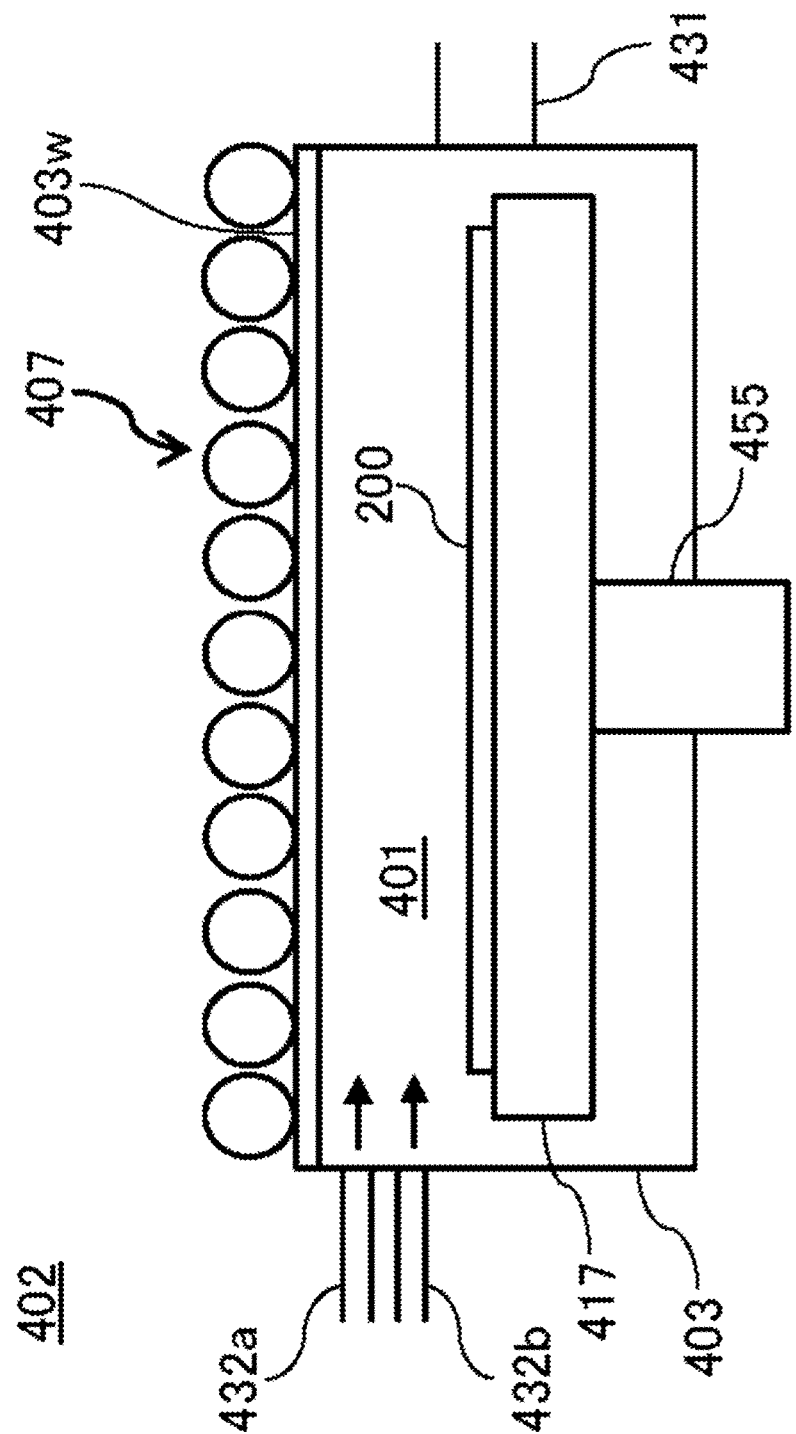
FIG. 17 is a diagram schematically illustrating a vertical processing furnace of a substrate processing apparatus which is used in still another embodiment described herein, including a longitudinal sectional view of the processing furnace.

The described technique may also be desirably applied when forming a film using a substrate processing apparatus having a processing furnace 402 illustrated in FIG. 17, for example. The processing furnace 402 includes a processing container 403 having a process chamber 401 installed therein; a support 417 supporting one or more wafers 200 in a horizontal position; a rotating shaft 455 supporting the support 417 from thereunder; a lamp heater 407 irradiating light toward the wafer 200 in the processing container 403; and a quartz window 403w transmitting light of the lamp heater 407. A gas supply port 432a for supplying the above-described source gas and a gas supply port 432b for supplying the above-described reaction gas are connected to the processing container 403. A gas supply system having substantially the same configuration as the source gas supply system according to the above-described embodiment is connected to the gas supply port 432a. A gas supply system having substantially the same configuration as the reaction gas supply system according to the above-described embodiment is connected to the gas supply port 432b. The gas supply ports 432a and 432b are installed at a side of the end portion of the wafer 200 loaded into the process chamber 401. In other words, the gas supply ports 432a and 432b are installed at locations that do not face the surface of the wafer 200 loaded into the process chamber 401. An exhaust port 431 for exhausting the process chamber 401 is installed at the processing container 403. An exhaust system having the substantially the same configuration as the exhaust system according to the above-described embodiment is connected to the exhaust port 431.

Even when those substrate processing apparatuses are used, a film can be formed according to the same processing sequences and conditions as the above-described embodiments or modifications.

The above-described embodiments and modifications may be properly combined and used. When the above-described embodiments and modifications are combined and used, the same processing conditions as the above-described embodiments may be applied.

EXAMPLE

Hereafter, experimental results supporting the effects which can be obtained by the above-described embodiments or modifications will be described.

<Evaluation for Number of Particles>

In order to evaluate the number of particles, first to third samples were manufactured by the substrate processing apparatus used in the above-described embodiments. By performing a cycle a predetermined number of times, the cycle including a step of supplying HCDS gas to a wafer in the process chamber and a step of simultaneously supplying $O_2$ gas and $NH_3$ gas to the wafer in the process chamber, SiON film was formed as the first sample on the wafer. At this time, the step of supplying HCDS gas and the step of simultaneously supplying $O_2$ gas and $NH_3$ gas were performed non-simultaneously. At the step of supplying $O_2$ gas and $NH_3$ gas, the supply of $O_2$ gas and the supply of $NH_3$ gas were simultaneously started, and then simultaneously suspended. The HCDS gas was supplied through the first nozzle, and the $O_2$ gas and $NH_3$ gas were supplied through the second nozzle different from the first nozzle. The processing condition falls within the processing conditions of the above-described embodiments.

By performing a cycle a predetermined number of times, the cycle including a step of supplying HCDS gas to the wafer in the process chamber, a step of supplying $NH_3$ gas to the wafer in the process chamber, and a step of supplying $O_2$ gas to the wafer in the process chamber, SiON film was formed as the second sample on the wafer. At this time, the step of supplying HCDS gas, the step of supplying $NH_3$ gas, and the step of supplying $O_2$ gas were sequentially and non-simultaneously performed. The HCDS gas was supplied through the first nozzle, and the $O_2$ gas and $NH_3$ gas were supplied through the second nozzle different from the first nozzle. The same processing condition as the case that the first sample is formed may be applied as the processing condition.

By performing a cycle a predetermined number of times, the cycle including a step of supplying HCDS gas to the wafer in the process chamber and a step of supplying $O_2$ gas and $NH_3$ gas to the wafer in the process chamber, SiON film was formed as the third sample on the wafer. At this time, the step of supplying HCDS gas and the step of supplying $O_2$ gas and $NH_3$ gas are performed non-simultaneously. At the step of supplying $O_2$ gas and $NH_3$ gas, the supply of $O_2$ gas and the supply of $NH_3$ gas were simultaneously started, and the supply of $O_2$ gas was suspended before the supply of $NH_3$ gas was supplied. That is, the sub-step of simultaneously supplying $O_2$ gas and $NH_3$ gas as reaction gases and the sub-step of exclusively supplying $NH_3$ gas as a reaction gas were sequentially and consecutively performed. The HCDS gas was supplied through the first nozzle, and the $O_2$ gas and $N_3$ gas were supplied through the second nozzle different from the first nozzle. The same processing condition as the case that the first sample is formed may be applied as the processing condition.

For the first to third samples formed in such a manner, the number of particles adhering to the surface of the wafer was measured before and after film forming.

Figure 11A:
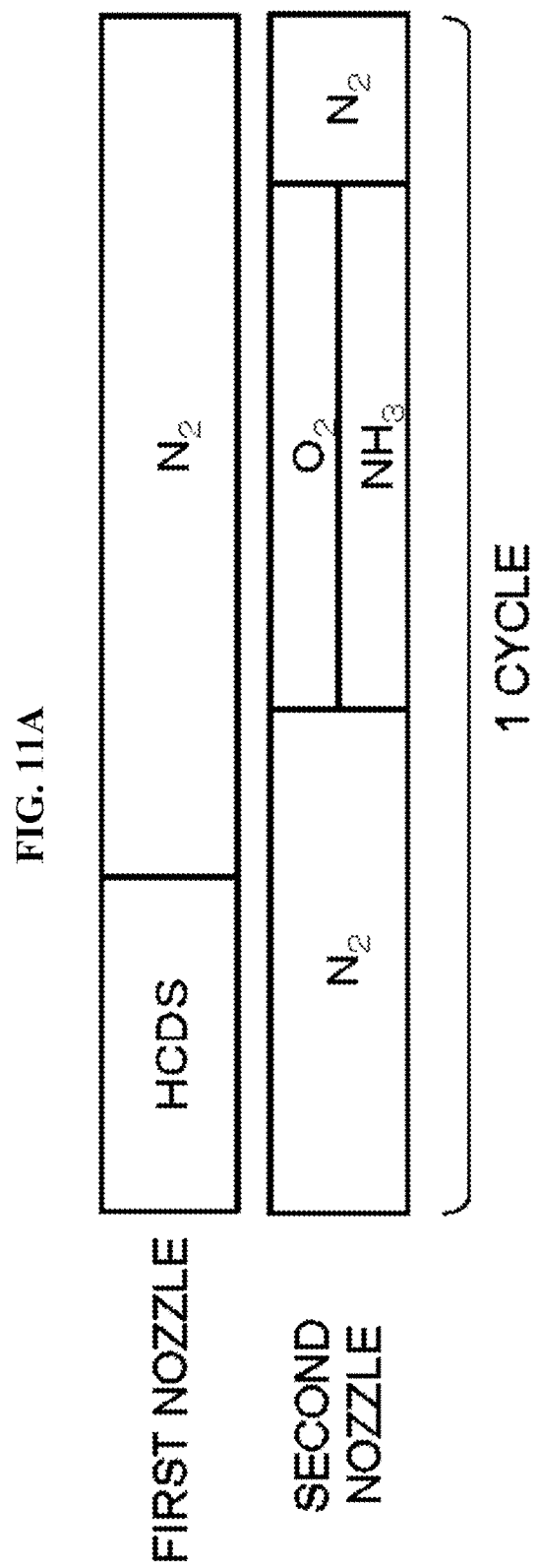
FIG. 11A is a diagram illustrating timings at which gases are supplied during one cycle of a film-forming sequence used for forming a first sample, for each nozzle.
Figure 11B:
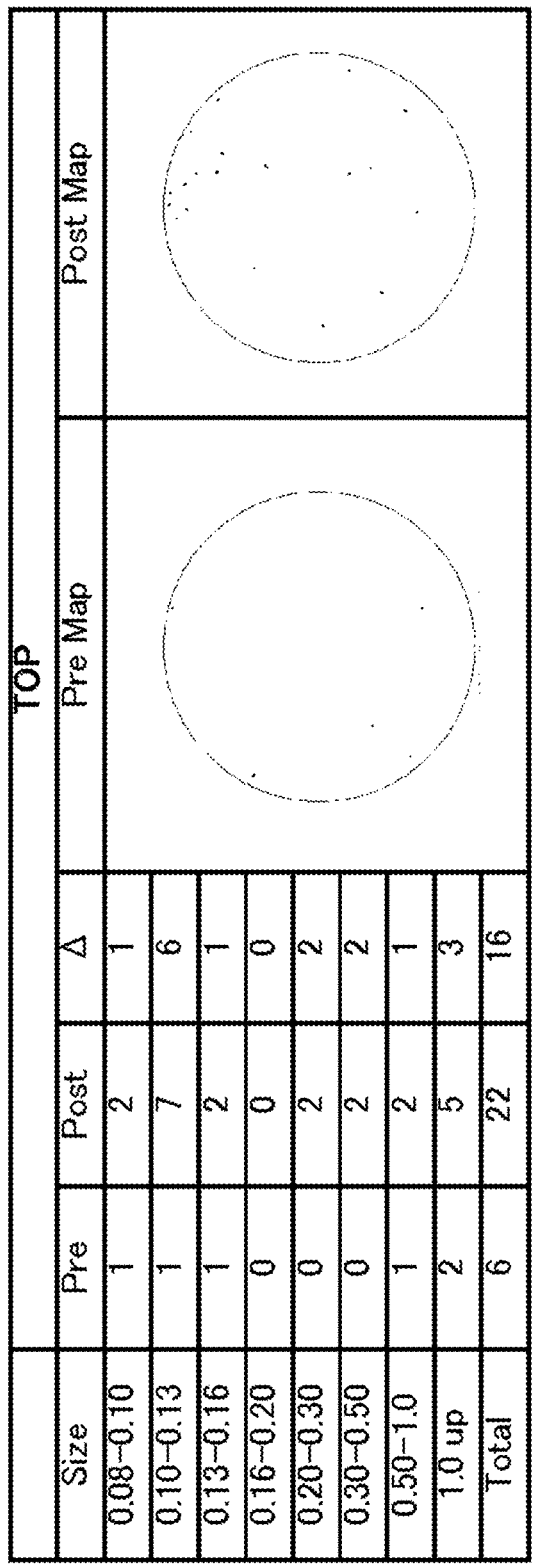
FIG. 11B is a diagram illustrating a result obtained by measuring the number of particles in a wafer disposed at TOP region.
Figure 11C:
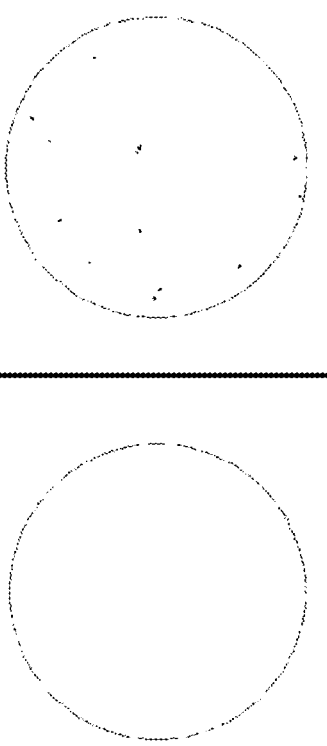
FIG. 11C is a diagram illustrating a result obtained by measuring the number of particles in a wafer disposed at CENTER region.
Figure 11D:
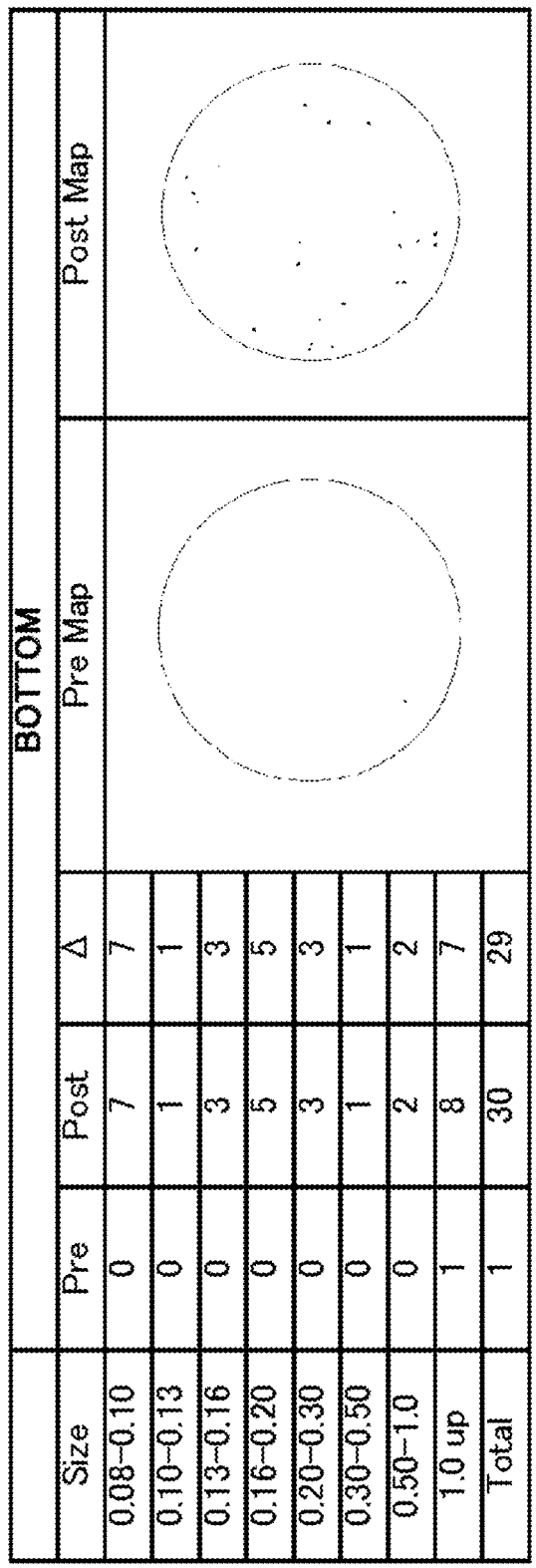
FIG. 11D is a diagram illustrating a result obtained by measuring the number of particles in a wafer disposed at BOTTOM region.
Figure 12A:
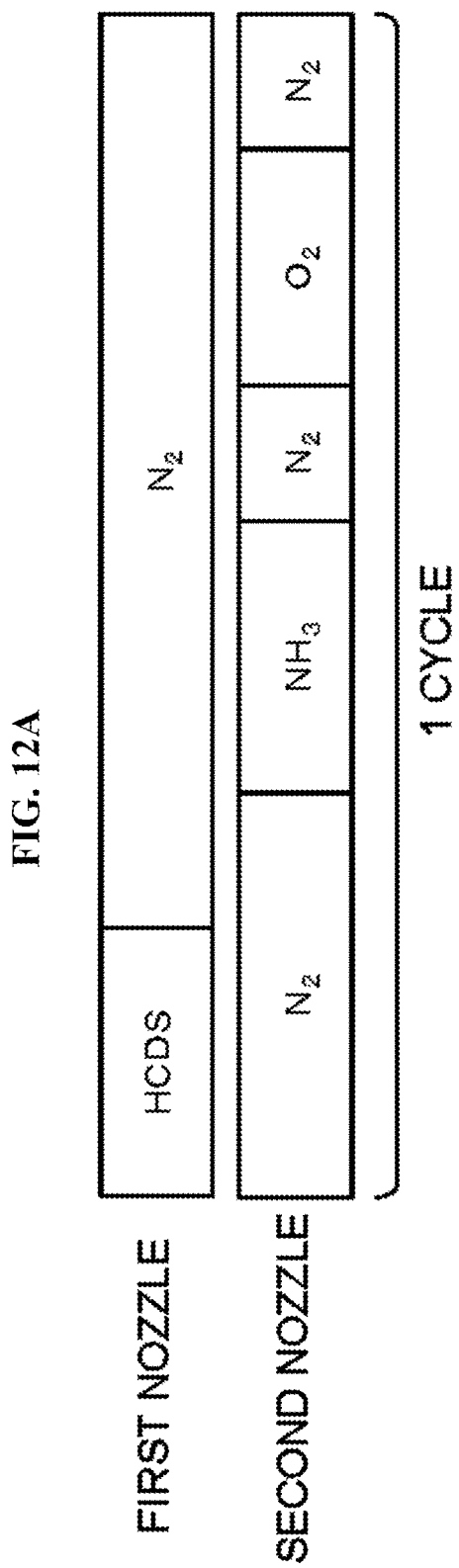
FIG. 12A is a diagram illustrating timings at which gases are supplied during one cycle of a film-forming sequence used for forming a second sample, for each nozzle.
Figure 12B:
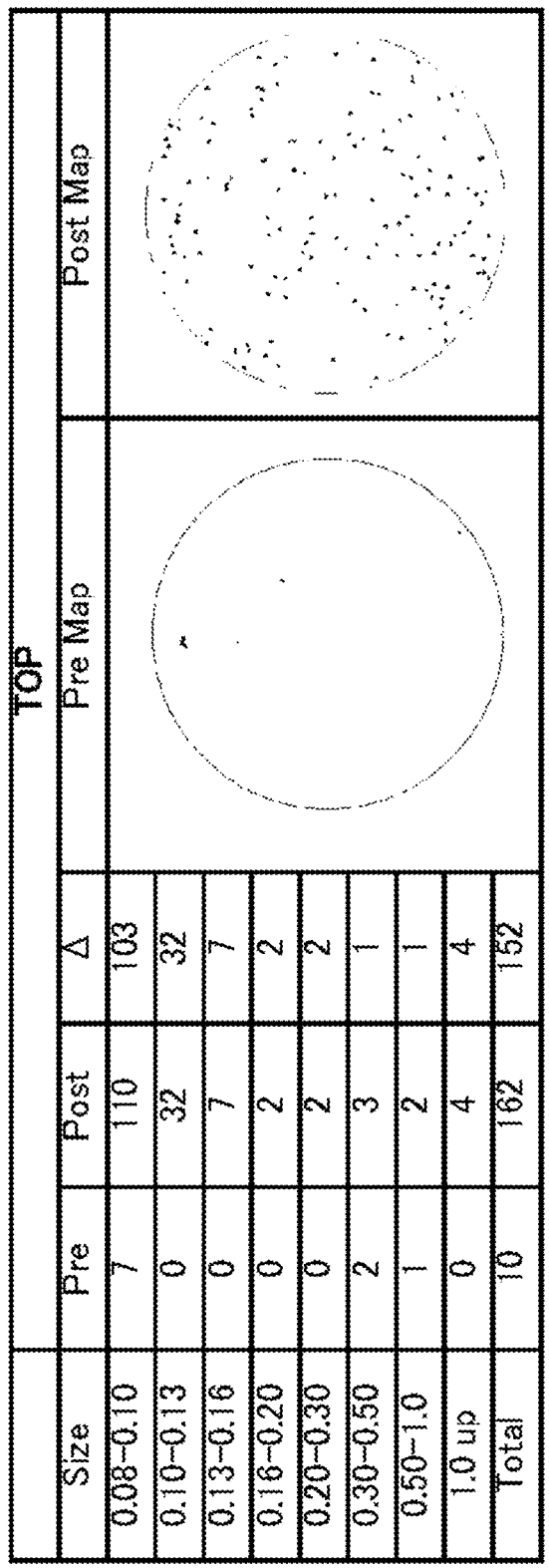
FIG. 12B is a diagram illustrating a result obtained by measuring the number of particles in a wafer disposed at TOP region.
Figure 12C:
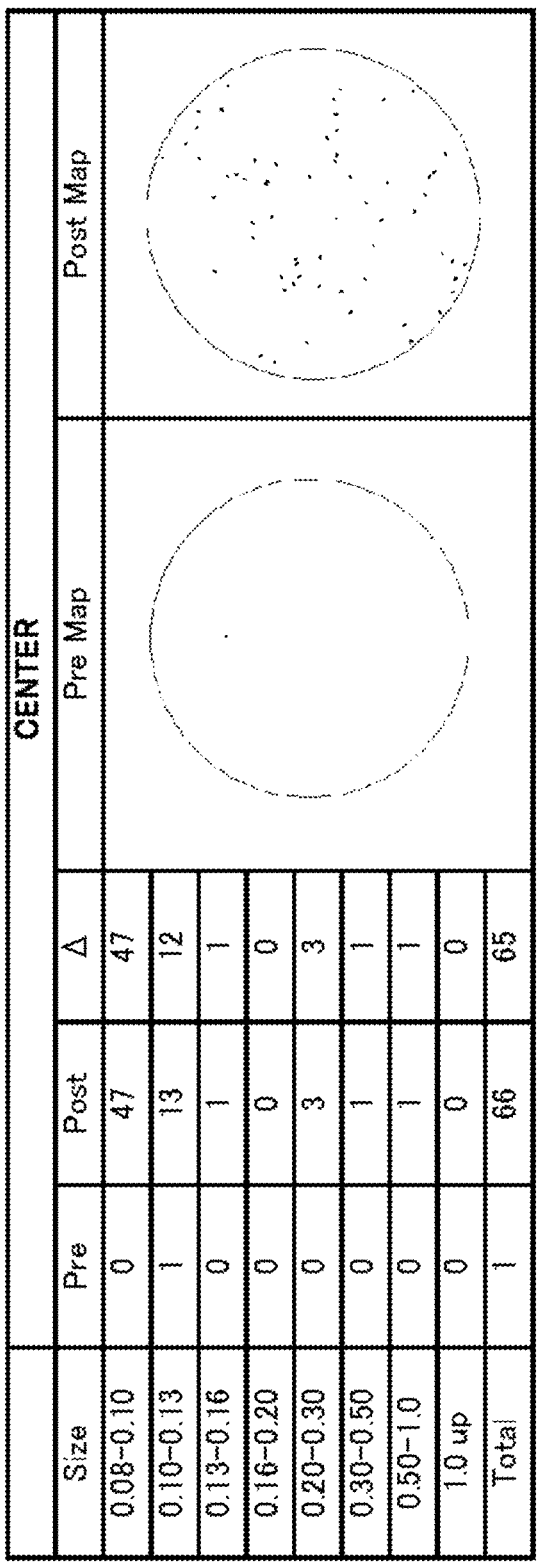
FIG. 12C is a diagram illustrating a result obtained by measuring the number of particles in a wafer disposed at CENTER region.
Figure 12D:
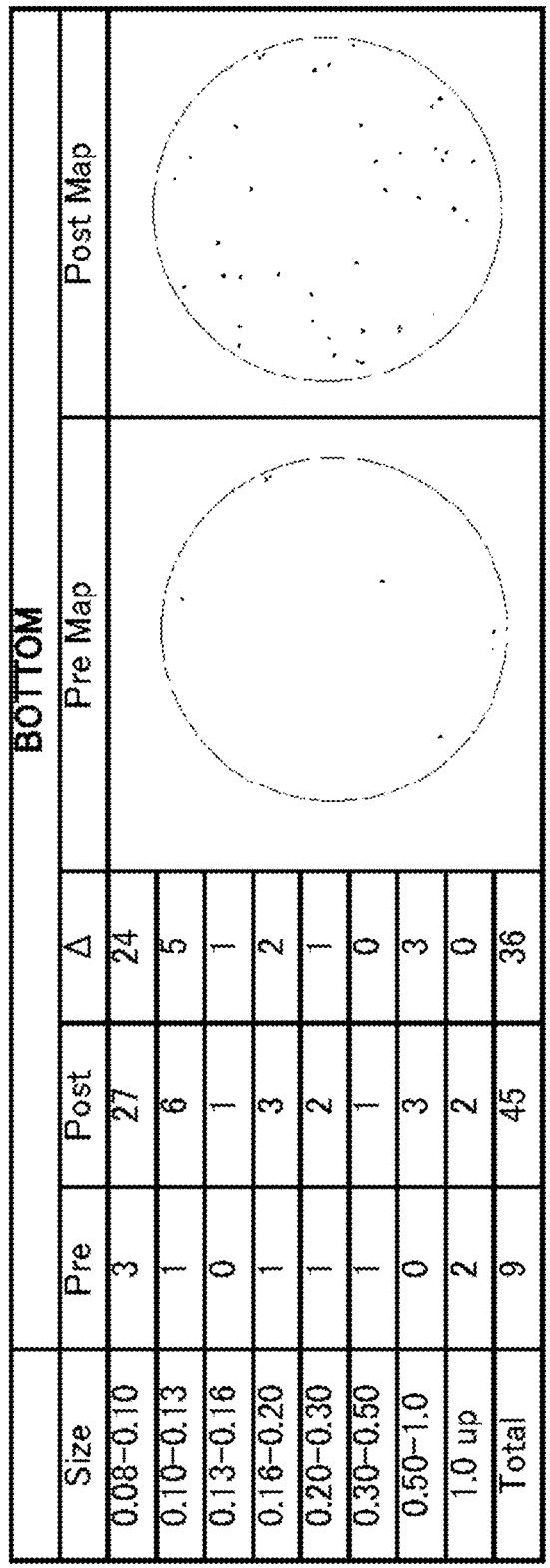
FIG. 12D is a diagram illustrating a result obtained by measuring the number of particles in a wafer disposed at BOTTOM region.
Figure 13B:
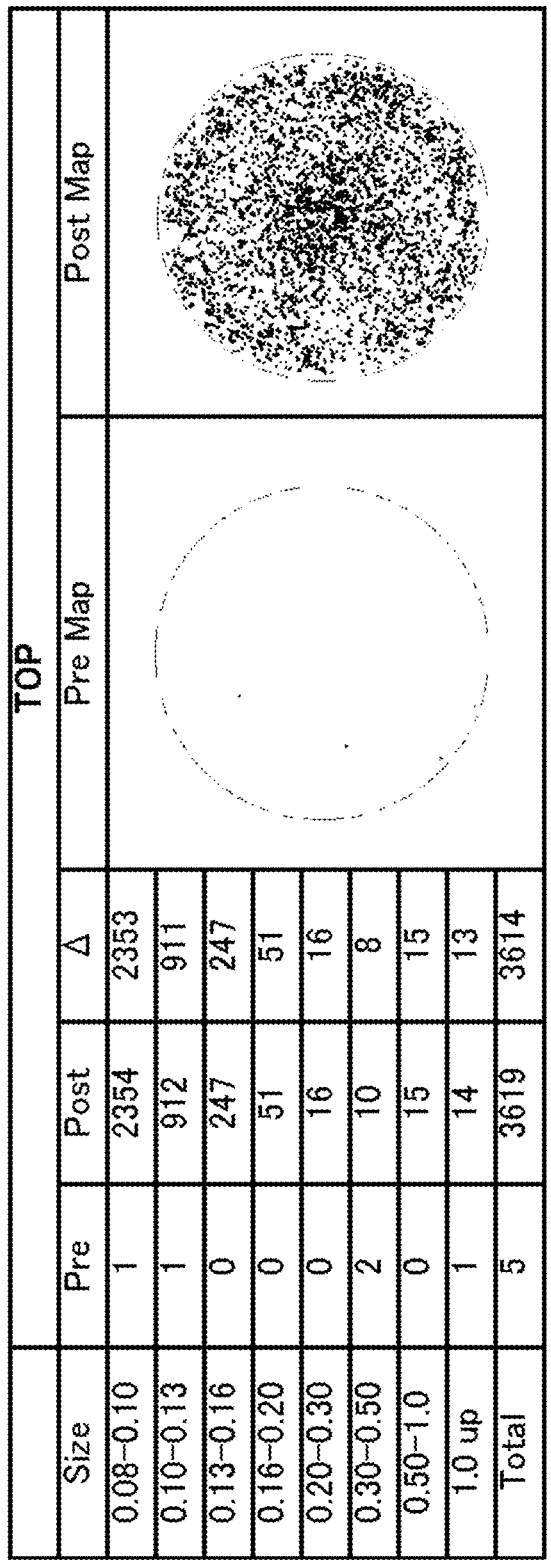
FIG. 13B is a diagram illustrating a result obtained by measuring the number of particles in a wafer disposed at TOP region.
Figure 13C:
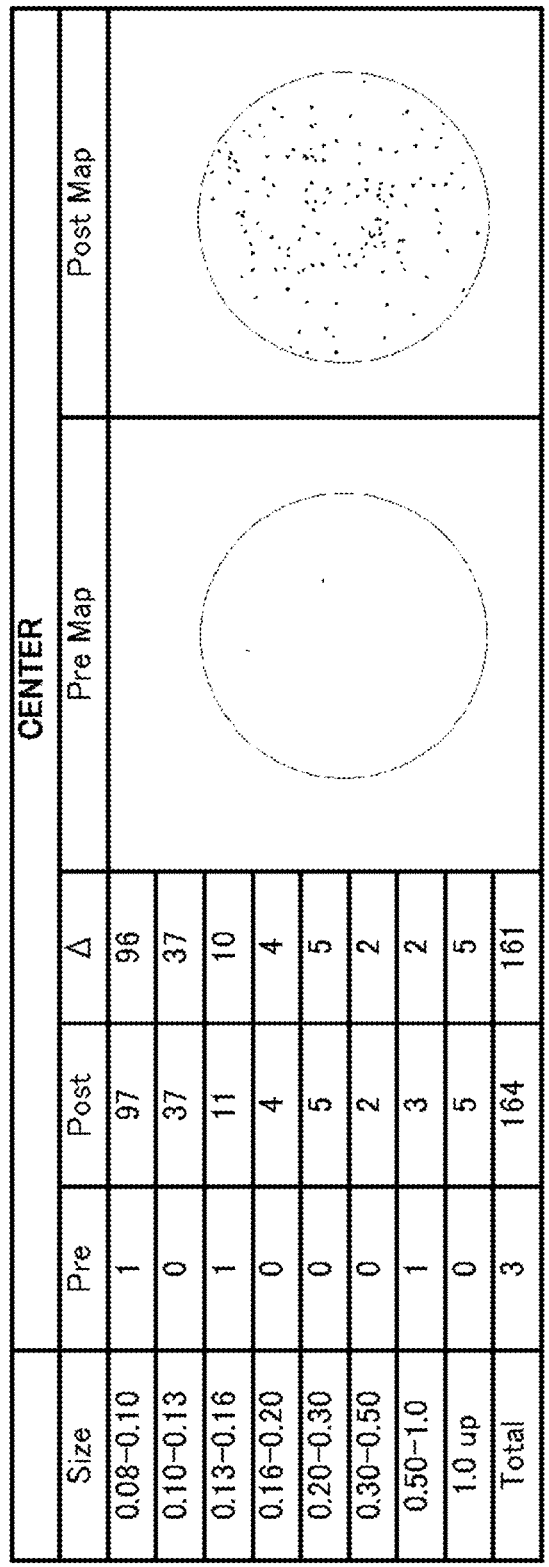
FIG. 13C is a diagram illustrating a result obtained by measuring the number of particles in a wafer disposed at CENTER region.
Figure 13D:
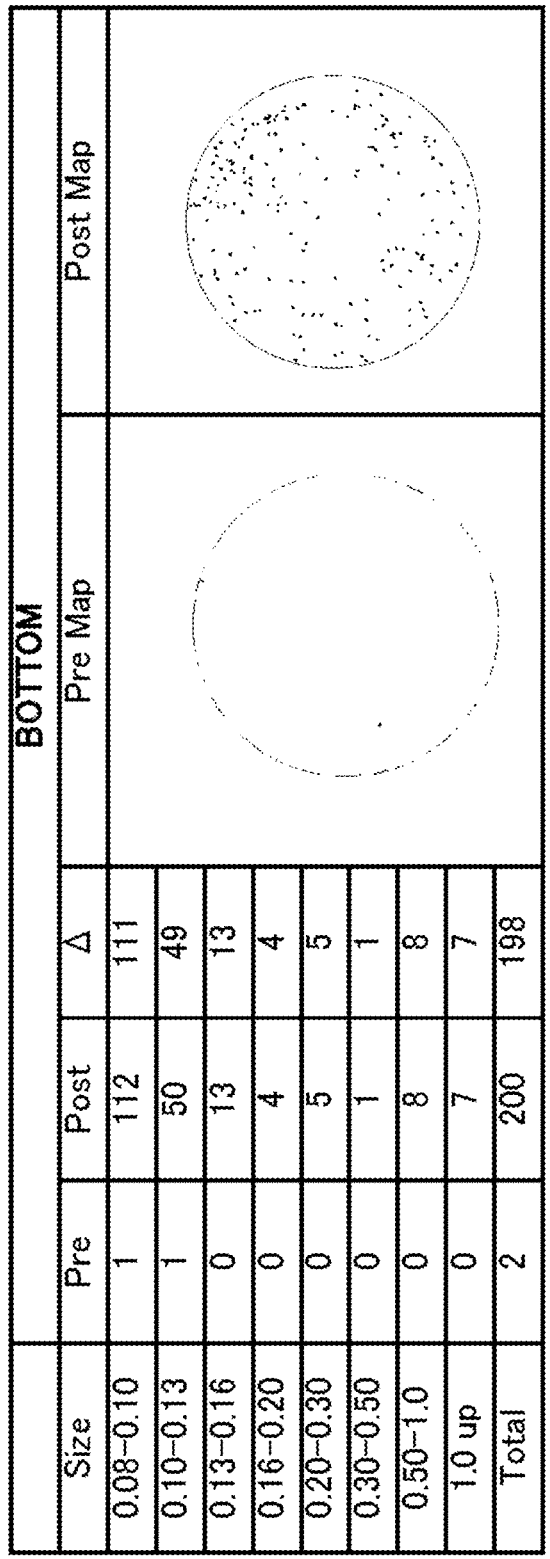
FIG. 13D is a diagram illustrating a result obtained by measuring the number of particles in a wafer disposed at BOTTOM region.

FIGS. 11A, 12A and 13A illustrate timings at which gases are supplied during one cycle in the film-forming sequences for forming the first to third samples, for each nozzle. FIGS. 11B through 11D, FIGS. 12B through 12D and FIG. 13B through 13D show results obtained by measuring the numbers of particles in the wafers of the first to third samples. In each of the drawings, "TOP", "CENTER" and "BOTTOM" represent the positions of the wafer in the boat, sequentially indicating the upper portion, the center portion and the lower portion of the boat. "Size" represents the outer diameter of a particle. "Pre" represents the number of particles observed on the surface of the wafer before film forming, "Post" represents the number of particles observed on the surface of the wafer after film forming, "A" represents a difference therebetween, and "Total" represents the sum of the numbers of particles at "Pre", "Post" and "A". A drawing illustrated in "Pre Map" shows the surface of the wafer before film forming, and a drawing illustrated in "Post Map" shows the surface of the wafer after film forming.

Referring to the drawings, the number of particles observed on the surface of the wafer after film forming, in the first sample formed through the film-forming sequence which includes a time period during which $O_2$ gas and $NH_3$ gas are simultaneously passed to the second nozzle and does not a time period during which $NH_3$ gas is exclusively passed as a reaction gas to the second nozzle, is much smaller than the number of particles observed on the surface of the wafer after film forming, in the second and third samples formed through the film-forming sequence including a time period during which NH$_3$ gas is exclusively passed as a reaction gas to the second nozzle. That is, by simultaneously passing O$_2$ gas and NH$_3$ gas to the second nozzle or the process chamber without exclusively passing NH$_3$ gas as a reaction gas, the number of particles in the process chamber can be significantly reduced. According to another evaluation performed by the inventors of the present application, when NH$_3$ gas and O$_2$ gas are simultaneously supplied, the O$_2$ gas may be supplied before the NH$_3$ gas is supplied, or the O$_2$ gas may be continuously supplied after the supply of the NH$_3$ gas is suspended. Such a configuration can reliably prevent the NH$_3$ gas as a reaction gas from exclusively flowing in the second nozzle or the process chamber, thereby reliably reducing the number of particles in the process chamber.

<Evaluation for Controllability of Composition Ratio>

In order to evaluate the controllability of a composition ratio, fourth and fifth samples were formed by the substrate processing apparatus used in the above-described embodiments. According to the same film-forming sequence as the first sample, SiON film was formed as the fourth sample on a wafer. The processing condition falls within the processing conditions of the above-described embodiments.

According to the film-forming sequence of FIG. 6, SiON film was formed as the fifth sample on the wafer. At this time, HCDS gas was used as a source gas, O$_2$ gas was used as an oxidizing gas, and NH$_3$ gas was used as a nitriding gas. A gas supply time required when O$_2$ gas and NH$_3$ gas are simultaneously performed is equal to that of the fourth sample. The gas supply time required when O$_2$ gas is supplied after the supply of NH$_3$ gas is suspended is equal to the gas supply time required when O$_2$ gas and NH$_3$ gas are simultaneously supplied. The other processing conditions are the same as the case that the fourth sample is formed.

For the fourth and fifth samples, the thickness distribution "Thick Map" at the surfaces of the SiON films, the average thickness "Thick" at the surfaces of the SiON films, the uniformity "WiW" of the thickness at the surface of the wafer, the uniformity "WtW" of the thickness between the wafers, and the N concentration and refractive indexes "R.I" of the films were measured.

FIGS. 14A and 15A illustrate timings at which gases are supplied during one cycle of the film-forming sequence of forming the fourth and fifth samples, for each nozzle. FIGS. 14B and 15B show "Thick Map", "Thick" (A), "WiW" (%), "WtW" (%), N concentration (%) and "R.I" (a.u.) of the SiON films of the fourth and fifth samples. In the drawings, "TOP", "CENTER" and "BOTTOM" have the same meanings as FIGS. 11A through 13D.

Referring to FIGS. 14A through 15B, the fifth sample including the sub-step of supplying O$_2$ gas after the supply of NH$_3$ gas is suspended can reduce the N concentration of the SiON film, compared to the fourth sample which does not include the sub-step. That is, when the sub-step of supplying O$_2$ gas is performed after the supply of NH$_3$ gas is suspended, the composition ratio (N concentration) of the SiON film can be precisely controlled. Even when such a sub-step was performed, the characteristics of the formed film, such as "WiW", "WtW" and "R.I.", are appropriate. According to another evaluation performed by the inventors of the present application, the supply time of O$_2$ gas, the flow rate of O$_2$ gas and the partial pressure of O$_2$ gas may be increased at the sub-step of supplying O$_2$ gas after suspending the supply of NH$_3$ gas, in order to reduce the N concentration of the SiON film.

According to the technique described herein, it is possible to suppress a production of particles when an oxynitride film is formed on a substrate.

What is claimed is:

1. A method of manufacturing a semiconductor device, comprising:
    performing a cycle a predetermined number of times to form an oxynitride film on a substrate, the cycle comprising: (a) supplying a source gas to the substrate via a first nozzle; and (b) supplying a nitriding gas and an oxidizing gas to the substrate via a second nozzle different from the first nozzle, wherein (a) and (b) are performed non-simultaneously,
    wherein (b) comprises: (b-1) supplying only the oxidizing gas while suspending a supply of the nitriding gas; and (b-2) simultaneously supplying the nitriding gas and the oxidizing gas, wherein (b-1) and (b-2) are consecutively performed.

2. The method of claim 1, wherein (b-1) comprises at least one of: (b-1-1) supplying the oxidizing gas before supplying the nitriding gas; and (b-1-2) supplying the oxidizing gas after suspending the supply of the nitriding gas.

3. The method of claim 1, wherein (b-1) comprises: (b-1-1) supplying the oxidizing gas before supplying the nitriding gas, and (b-1-1) and (b-2) are consecutively performed in (b).

4. The method of claim 1, wherein (b-1) comprises: (b-1-2) supplying the oxidizing gas after suspending the supply of the nitriding gas, and (b-2) and (b-1-2) are consecutively performed in (b).

5. The method of claim 1, wherein (b-1) comprises: (b-1-1) supplying the oxidizing gas before supplying the nitriding gas; and (b-1-2) supplying the oxidizing gas after suspending the supply of the nitriding gas, and (b-1-1), (b-2) and (b-1-2) are consecutively performed in (b).

6. The method of claim 1, wherein (b) further comprises (b-3) suspending both of the supply of the nitriding gas and a supply of the oxidizing gas.

7. The method of claim 2, wherein at least a portion of a layer formed on the substrate before performing (b-1-1) is oxidized by performing (b-1-1).

8. The method of claim 2, wherein at least a portion of a layer formed on the substrate before performing (b-1-2) is oxidized by performing (b-1-2) and a portion of nitrogen in the layer formed on the substrate before performing (b-1-2) is removed by performing (b-1-2).

9. The method of claim 1, wherein a composition ratio of the oxynitride film is controlled by adjusting a condition of supplying the oxidizing gas in (b-1).

10. The method of claim 2, wherein a composition ratio of the oxynitride film is controlled by adjusting a condition of supplying the oxidizing gas in (b-1-1).

11. The method of claim 2, wherein a composition ratio of the oxynitride film is controlled by adjusting a condition of supplying the oxidizing gas in (b-1-2).

12. The method of claim 5, wherein a condition of supplying the oxidizing gas in (b-1-2) is different from a condition of supplying the oxidizing gas in (b-1-1).

13. The method of claim 1, wherein the cycle further comprises supplying to the substrate a gas containing at least one element selected from a group consisting of carbon and boron.

* * * * *